(12) United States Patent
Kishimoto et al.

(10) Patent No.: US 11,309,481 B2
(45) Date of Patent: Apr. 19, 2022

(54) MULTI-LAYER PIEZOELECTRIC CERAMIC COMPONENT-MOUNTED PIEZOELECTRIC DEVICE

(71) Applicant: TAIYO YUDEN CO., LTD., Tokyo (JP)

(72) Inventors: Sumiaki Kishimoto, Takasaki (JP); Hiroyuki Shimizu, Takasaki (JP); Tomohiro Harada, Takasaki (JP); Takayuki Goto, Takasaki (JP); Yukihiro Konishi, Takasaki (JP)

(73) Assignee: TAIYO YUDEN CO., LTD, Tokyo (JP)

( * ) Notice: Subject to any disclaimer, the term of this patent is extended or adjusted under 35 U.S.C. 154(b) by 630 days.

(21) Appl. No.: 16/258,370

(22) Filed: Jan. 25, 2019

(65) Prior Publication Data

US 2019/0237653 A1 Aug. 1, 2019

(30) Foreign Application Priority Data

Jan. 30, 2018 (JP) .............................. JP2018-013961
Jan. 30, 2018 (JP) .............................. JP2018-013963

(51) Int. Cl.
*H01L 41/083* (2006.01)
*H01L 41/187* (2006.01)
(Continued)

(52) U.S. Cl.
CPC ........ *H01L 41/083* (2013.01); *H01L 41/0471* (2013.01); *H01L 41/09* (2013.01); *H01L 41/187* (2013.01)

(58) Field of Classification Search
CPC ..... H01L 41/083; H01L 41/187; H01L 41/09; H01L 41/0471
See application file for complete search history.

(56) References Cited

U.S. PATENT DOCUMENTS 5,233,256 A * 8/1993 Hayashi ................ H01L 41/083
310/317
6,731,050 B2 * 5/2004 Bindig ................ H01L 41/0838
29/25.35
(Continued)

FOREIGN PATENT DOCUMENTS

JP 61239682 A * 10/1986 ......... H01L 41/0472
JP 2001210545 A 8/2001
(Continued)

*Primary Examiner* — J. San Martin
(74) *Attorney, Agent, or Firm* — Law Office of Katsuhiro Arai

(57) ABSTRACT

A multi-layer piezoelectric ceramic component includes: a piezoelectric ceramic body having a cuboid shape, having upper and lower surfaces facing in a thickness direction, first and second end surfaces facing in a length direction, and a pair of side surfaces facing in a width direction, and including first and second regions; first internal electrodes in the first region; second internal electrodes in the second region; third internal electrodes in the first and second regions; a first terminal electrode formed on the first end surface and electrically connected to the first internal electrodes; a second terminal electrode formed on the first end surface and electrically connected to the second internal electrodes; and a third terminal electrode formed on the second end surface and electrically connected to the third internal electrodes, the first, second, and third internal electrodes each having a width equal to a distance between the pair of side surfaces.

7 Claims, 29 Drawing Sheets

(51) Int. Cl.
*H01L 41/09* (2006.01)
*H01L 41/047* (2006.01)

(56) References Cited

U.S. PATENT DOCUMENTS

| | | | |
|---|---|---|---|
| 2007/0080612 A1* | 4/2007 | Terazono | F02M 51/0603 |
| | | | 310/366 |
| 2007/0269667 A1* | 11/2007 | Kobayashi | H01L 41/0838 |
| | | | 428/469 |
| 2013/0241352 A1 | 9/2013 | Hayashi et al. | |

FOREIGN PATENT DOCUMENTS

| | | | |
|---|---|---|---|
| JP | 2006310700 A | | 11/2006 |
| JP | 2007150200 A | * | 6/2007 |
| WO | 2013051328 A1 | | 4/2013 |

\* cited by examiner

MULTI-LAYER PIEZOELECTRIC CERAMIC COMPONENT-MOUNTED PIEZOELECTRIC DEVICE

CROSS REFERENCE TO RELATED APPLICATIONS

This application claims the benefit of Japanese Priority Patent Application JP 2018-013961 filed Jan. 30, 2018, and Japanese Priority Patent Application JP 2018-013963 filed Jan. 30, 2018, the entire contents of which are incorporated herein by reference.

BACKGROUND

The present disclosure relates to a multi-layer piezoelectric ceramic component usable as a piezoelectric actuator and to a piezoelectric device.

A piezoelectric actuator is an actuator that includes a piezoelectric element including a piezoelectric material and an electrode and uses deformation that is caused in the piezoelectric material by an inverse piezoelectric effect when a voltage is applied to the electrode. The piezoelectric actuator includes a bimorph piezoelectric actuator that includes two piezoelectric actuators.

A general bimorph piezoelectric actuator has a structure in which the piezoelectric actuators are attached to both surfaces of a metal plate, and one of the piezoelectric actuators is expanded and the other one of the piezoelectric actuators is contracted, to enable the whole of the actuator to be largely deformed.

Further, in the bimorph piezoelectric actuator, a piezoelectric actuator having an element bimorph structure in which two piezoelectric actuators are integrated, i.e., an element bimorph actuator, is also developed (for example, Japanese Patent Application Laid-open No. 2001-210545, Japanese Patent Application Laid-open No. 2006-310700, and WO 2013/051328). The element bimorph actuator has optimal performance in displacement and generative force, as compared to a general bimorph piezoelectric actuator.

SUMMARY

However, the element bimorph actuator as disclosed in Japanese Patent Application Laid-open No. 2001-210545, Japanese Patent Application Laid-open No. 2006-310700, and WO 2013/051328, which includes an inactive portion (non-operation portion) on the side surface of the element, has the following problem: displacement is restrained by the inactive portion, and displacement performance is reduced with mechanical fatigue caused by large displacement.

In view of the circumstances as described above, it is desirable to provide a multi-layer piezoelectric ceramic component and a piezoelectric device that are capable of generating large displacement and preventing displacement performance from being reduced.

According to an embodiment of the present disclosure, there is provided a multi-layer piezoelectric ceramic component including a piezoelectric ceramic body, first internal electrodes, second internal electrodes, third internal electrodes, a first terminal electrode, a second terminal electrode, and a third terminal electrode.

The piezoelectric ceramic body has a cuboid shape in which a length is larger than a width and the width is larger than a thickness, has an upper surface and a lower surface facing each other in a thickness direction, a first end surface and a second end surface facing each other in a length direction, and a pair of side surfaces facing each other in a width direction, and includes a first region on a side of the upper surface in the thickness direction and a second region on a side of the lower surface in the thickness direction.

The first internal electrodes are formed in the first region and are drawn to the first end surface.

The second internal electrodes are formed in the second region and are drawn to the first end surface.

The third internal electrodes are formed in the first region and the second region and are drawn to the second end surface, the third internal electrodes being laminated alternately with the first internal electrodes in the first region at predetermined distances from the respective first internal electrodes in the thickness direction and being laminated alternately with the second internal electrodes in the second region at predetermined distances from the respective second internal electrodes in the thickness direction.

The first terminal electrode is formed on the first end surface and is electrically connected to the first internal electrodes.

The second terminal electrode is formed on the first end surface, is electrically insulated from the first terminal electrode, and is electrically connected to the second internal electrodes.

The third terminal electrode is formed on the second end surface and is electrically connected to the third internal electrodes.

The first internal electrodes, the second internal electrodes, and the third internal electrodes each have a width equal to a distance between the pair of side surfaces.

With such a configuration, when a voltage is applied between the first internal electrodes and the third internal electrodes, the piezoelectric ceramic body in the first region can be deformed, and when a voltage is applied between the second internal electrodes and the third internal electrodes, the piezoelectric ceramic body in the second region can be deformed. Therefore, the deformation in the first region and the deformation in the second region can be independently controlled. Here, the first internal electrodes, the second internal electrodes, and the third internal electrodes each have the width equal to the width of the piezoelectric ceramic body. In other words, the first internal electrodes, the second internal electrodes, and the third internal electrodes are exposed at the side surfaces of the piezoelectric ceramic body. When the first internal electrodes, the second internal electrodes, and the third internal electrodes are embedded in the piezoelectric ceramic body and are not exposed at the side surfaces, restraint by the piezoelectric ceramic body (side margins) covering the side surfaces of those internal electrodes suppresses the deformation of the multi-layer piezoelectric ceramic component. However, with the configuration described above, the restraint by the side margins is not caused, which makes it possible to prevent reduction in displacement performance.

The multi-layer piezoelectric ceramic component may further include at least one of a first surface electrode that is formed on the upper surface, is electrically connected to the third terminal electrode, and extends from the second end surface to face one of the first internal electrodes, or a second surface electrode that is formed on the lower surface, is electrically connected to the third terminal electrode, extends from the second end surface to face one of the second internal electrodes.

The pair of side surfaces may be covered with an insulating film made of an insulator different from the piezoelectric ceramic body. The insulator does not react chemically with the piezoelectric ceramic body.

The insulator may be made of an insulating resin material.

According to another embodiment of the present disclosure, there is provided a piezoelectric device including a vibration member and a multi-layer piezoelectric ceramic component.

The multi-layer piezoelectric ceramic component is mounted to the vibration member and includes a piezoelectric ceramic body, first internal electrodes, second internal electrodes, third internal electrodes, a first terminal electrode, a second terminal electrode, and a third terminal electrode.

The piezoelectric ceramic body has a cuboid shape in which a length is larger than a width and the width is larger than a thickness, has an upper surface and a lower surface facing each other in a thickness direction, a first end surface and a second end surface facing each other in a length direction, and a pair of side surfaces facing each other in a width direction, and includes a first region on a side of the upper surface in the thickness direction and a second region on a side of the lower surface in the thickness direction.

The first internal electrodes are formed in the first region and are drawn to the first end surface.

The second internal electrodes are formed in the second region and are drawn to the first end surface.

The third internal electrodes are formed in the first region and the second region and are drawn to the second end surface, the third internal electrodes being laminated alternately with the first internal electrodes in the first region at predetermined distances from the respective first internal electrodes in the thickness direction and being laminated alternately with the second internal electrodes in the second region at predetermined distances from the respective second internal electrodes in the thickness direction.

The first terminal electrode is formed on the first end surface and is electrically connected to the first internal electrodes.

The second terminal electrode is formed on the first end surface, is electrically insulated from the first terminal electrode, and is electrically connected to the second internal electrodes.

The third terminal electrode is formed on the second end surface and is electrically connected to the third internal electrodes.

The first internal electrodes, the second internal electrodes, and the third internal electrodes each have a width equal to a distance between the pair of side surfaces.

As described above, according to the present disclosure, it is possible to provide a multi-layer piezoelectric ceramic component and a piezoelectric device that are capable of generating large displacement and preventing displacement performance from being reduced.

These and other objects, features and advantages of the present disclosure will become more apparent in light of the following detailed description of embodiments thereof, as illustrated in the accompanying drawings.

DETAILED DESCRIPTION OF EMBODIMENTS

First Embodiment

A multi-layer piezoelectric ceramic component according to a first embodiment of the present disclosure will be described. In each of the following figures, three directions orthogonal to one another will be assumed as an X direction, a Y direction, and a Z direction.

Configuration of Multi-Layer Piezoelectric Ceramic Component

Figure 1:
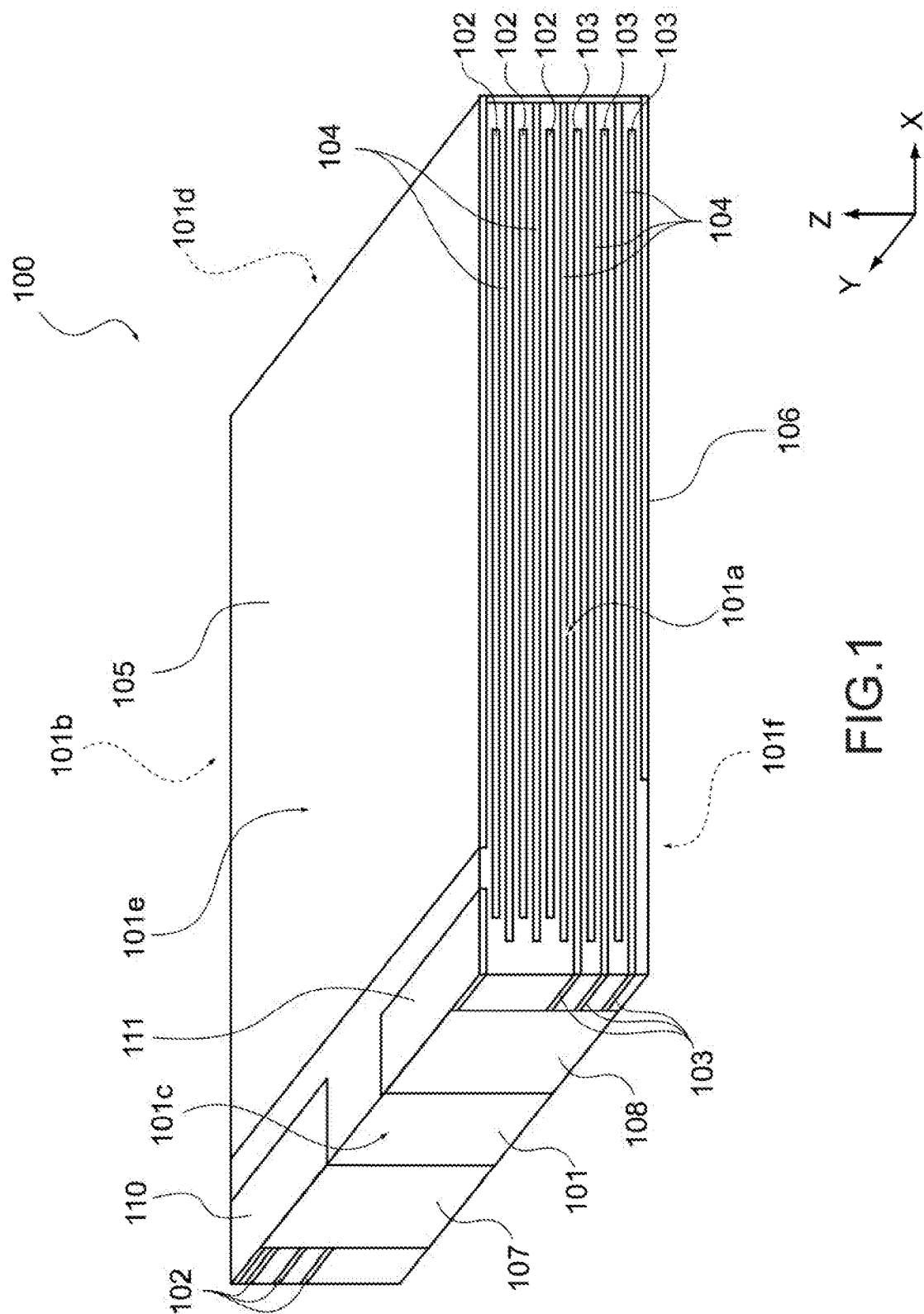
FIG. 1 is a perspective view of a multi-layer piezoelectric ceramic component according to a first embodiment of the present disclosure.
Figure 2:
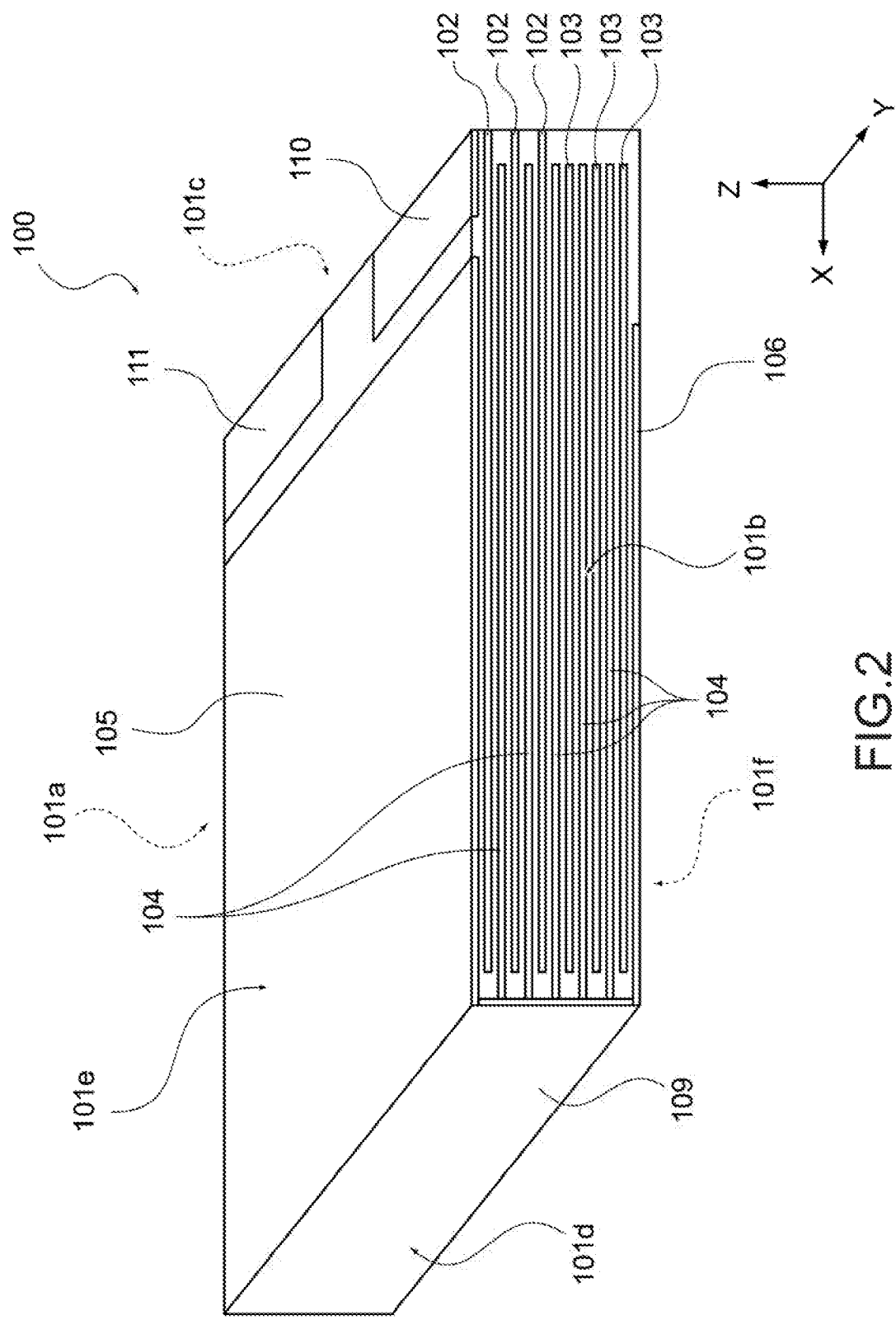
FIG. 2 is a perspective view of the multi-layer piezoelectric ceramic component.

FIGS. 1 and 2 are each a perspective view of a multi-layer piezoelectric ceramic component 100 according to the first embodiment. FIG. 2 is a view of the opposite side from FIG. 1.

As shown in FIGS. 1 and 2, the multi-layer piezoelectric ceramic component 100 includes a piezoelectric ceramic body 101, first internal electrodes 102, second internal electrodes 103, third internal electrodes 104, a first surface electrode 105, a second surface electrode 106, a first end surface terminal electrode 107, a second end surface terminal electrode 108, a third end surface terminal electrode 109, a first surface terminal electrode 110, and a second surface terminal electrode 111.

The piezoelectric ceramic body 101 is made of a piezoelectric ceramic material. The piezoelectric ceramic body 101 may be made of, for example, lithium niobate ($LiNbO_3$), lithium tantalite ($LiTaO_3$), or lead zirconate titanate ($PbZrO_3$—$PbTiO_3$).

As shown in FIGS. 1 and 2, the piezoelectric ceramic body 101 has a cuboid shape. Assuming that the X direction is a length, the Y direction is a width, and the Z direction is a thickness, the piezoelectric ceramic body 101 has such a shape that the length is larger than the width and the width is larger than the thickness (length>width>thickness).

For the surfaces of the piezoelectric ceramic body 101, surfaces facing in the width direction (Y direction) are assumed as a first side surface 101a and a second side surface 101b, and surfaces facing in the length direction (X direction) are assumed as a first end surface 101c and a second end surface 101d. Further, surfaces facing in the thickness direction (Z direction) are assumed as an upper surface 101e and a lower surface 101f.

Figure 3:
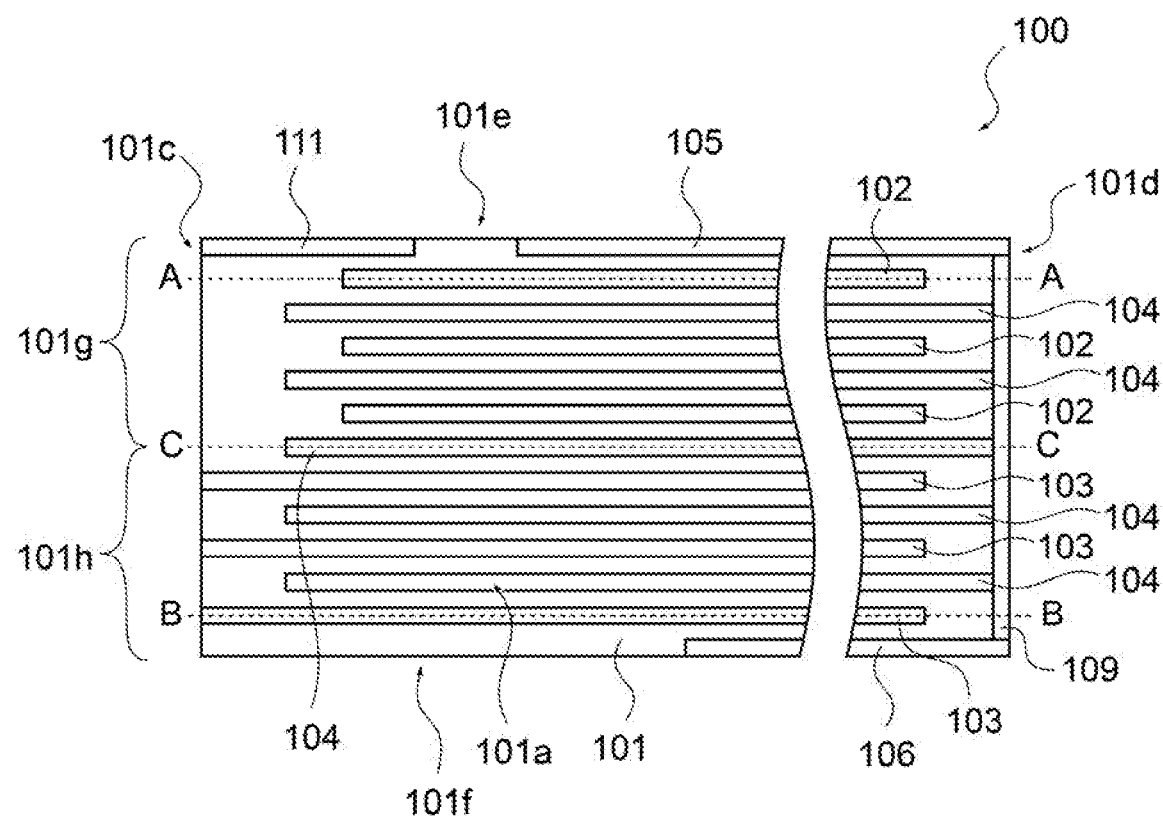
FIG. 3 is a plan view of a first side surface of the multi-layer piezoelectric ceramic component.
Figure 4:
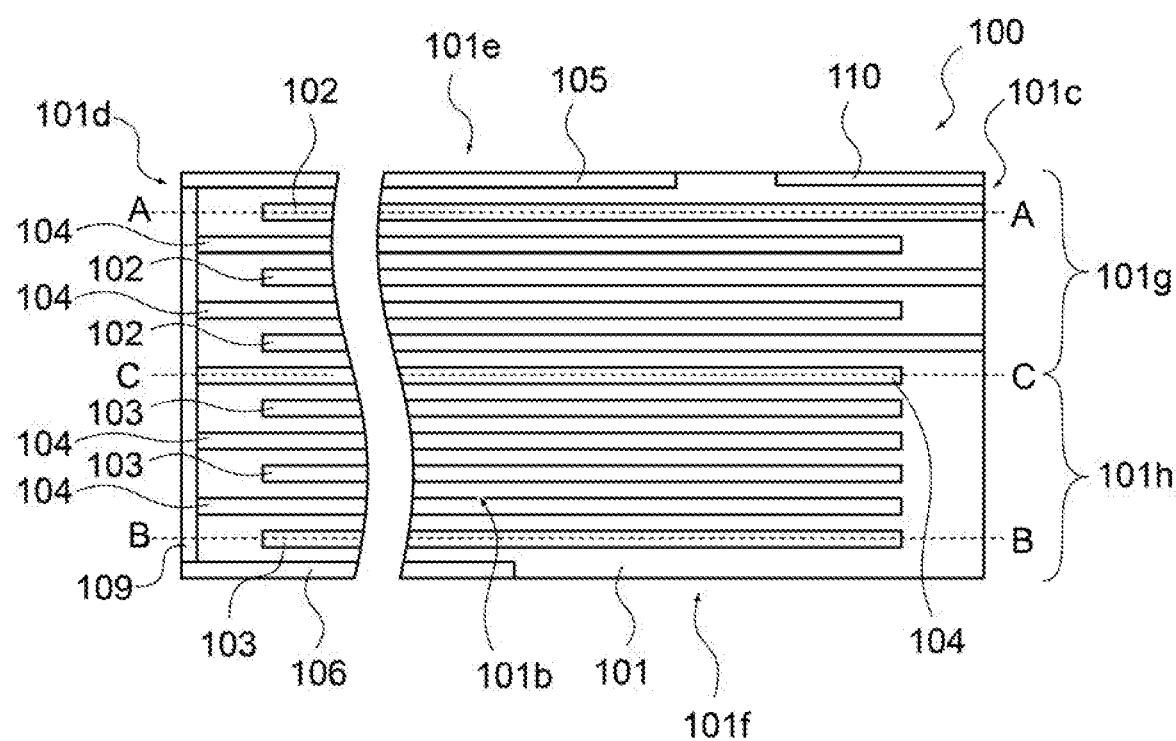
FIG. 4 is a plan view of a second side surface of the multi-layer piezoelectric ceramic component.
Figure 5:
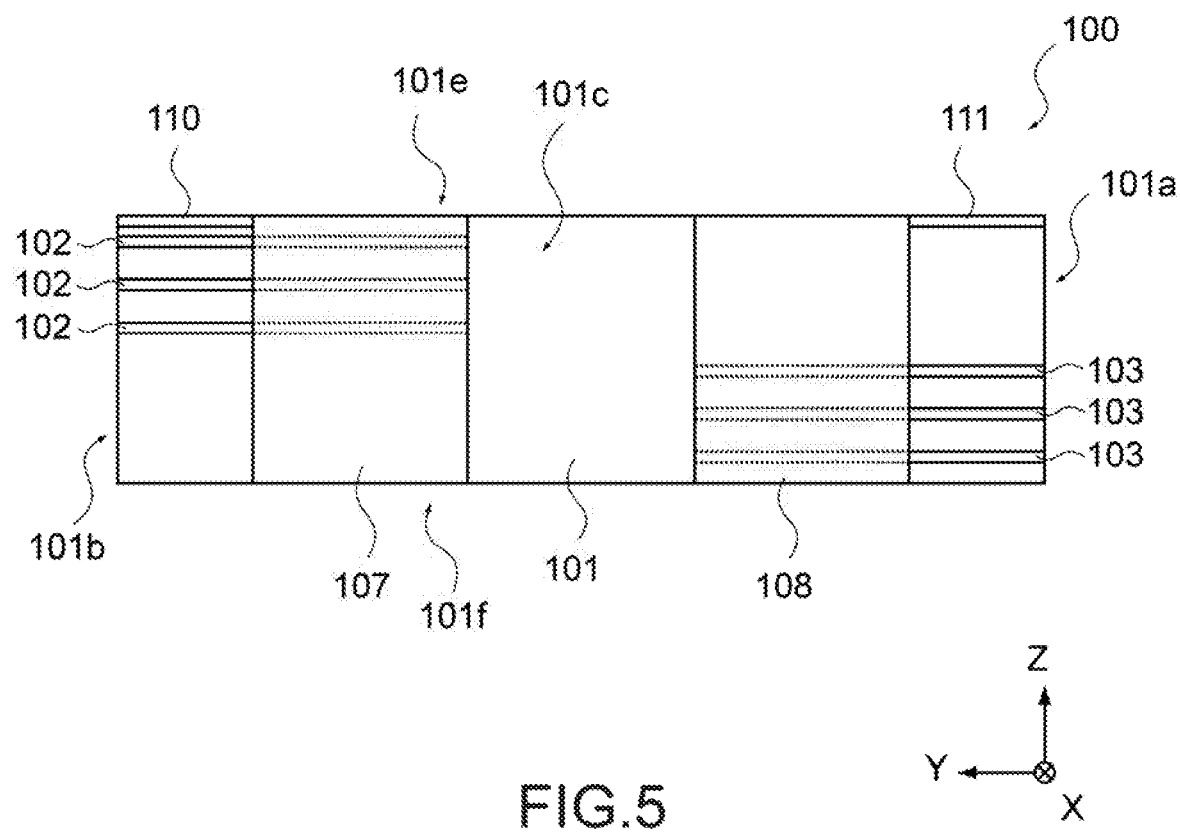
FIG. 5 is a plan view of a first end surface of the multi-layer piezoelectric ceramic component.
Figure 6:
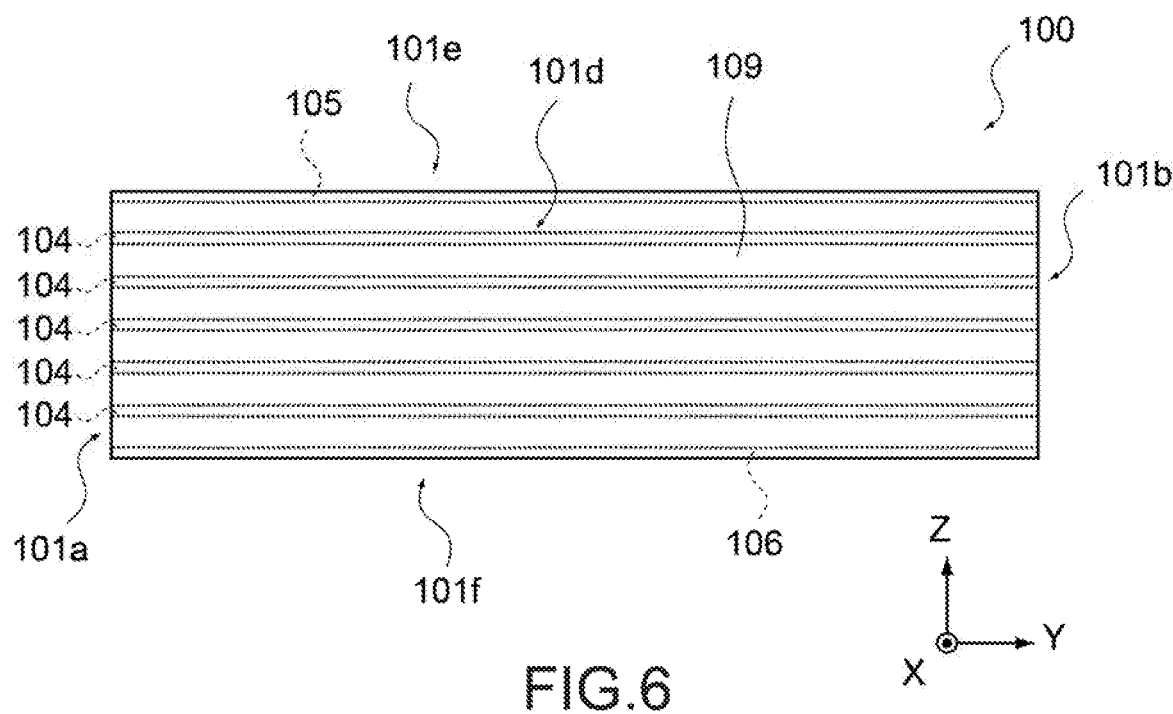
FIG. 6 is a plan view of a second end surface of the multi-layer piezoelectric ceramic component.
Figure 7:
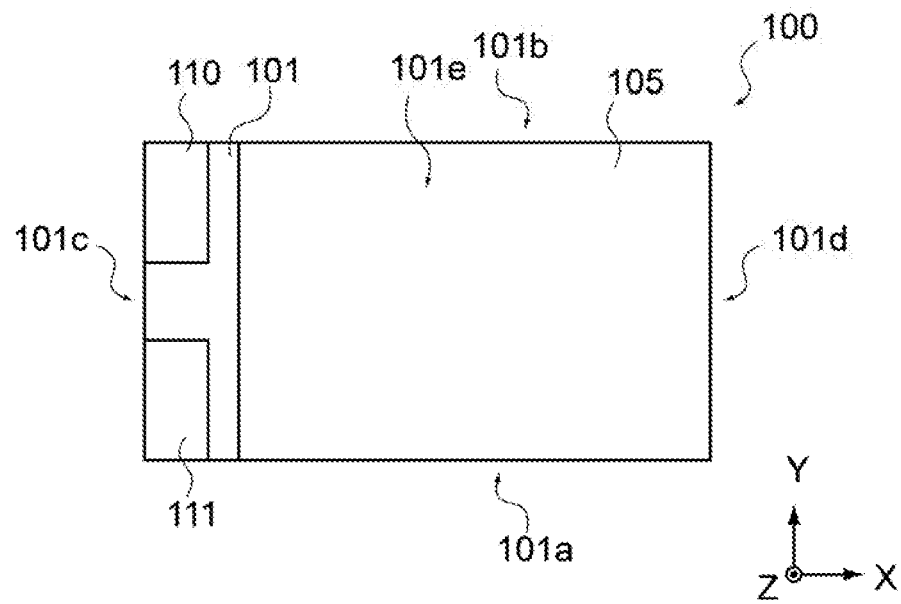
FIG. 7 is a plan view of an upper surface of the multi-layer piezoelectric ceramic component.
Figure 8:
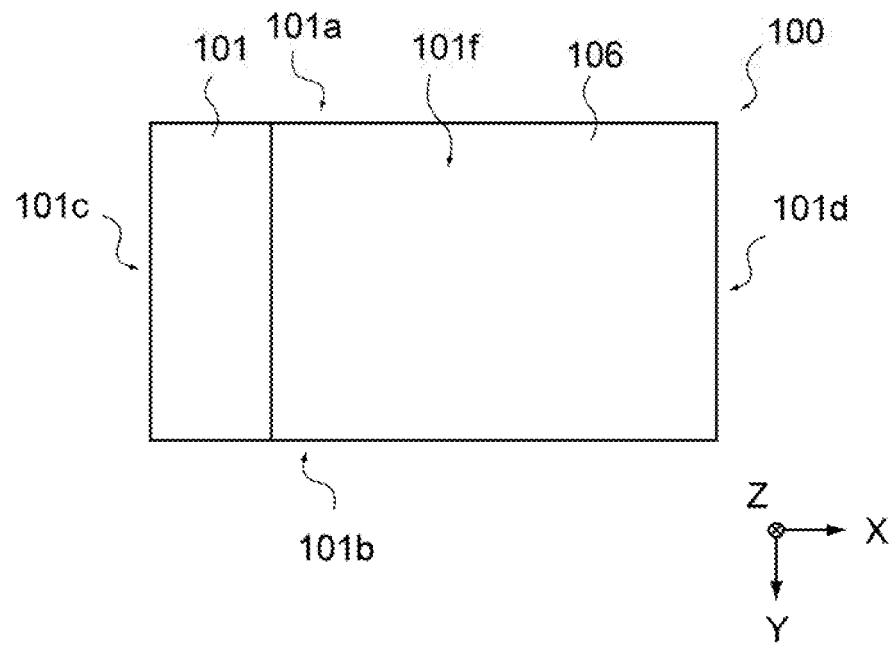
FIG. 8 is a plan view of a lower surface of the multi-layer piezoelectric ceramic component.

FIG. 3 is a plan view of the first side surface 101a. FIG. 4 is a plan view of the second side surface 101b. FIG. 5 is a plan view of the first end surface 101c. FIG. 6 is a plan view of the second end surface 101d. FIG. 7 is a plan view of the upper surface 101e. FIG. 8 is a plan view of the lower surface 101f.

As shown in FIGS. 3 and 4, the piezoelectric ceramic body 101 includes a first region 101g on the upper surface 101e side and a second region 101h on the lower surface 101f side. The thickness of the first region 101g and the thickness of the second region 101h suitably have a ratio of 1:1.

Figure 9:
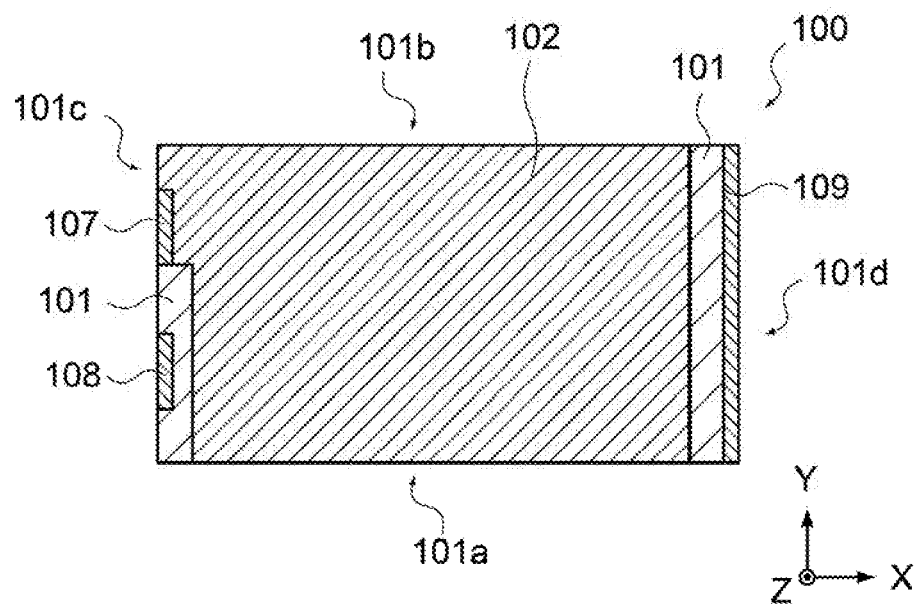
FIG. 9 is a cross-sectional view of a first internal electrode of the multi-layer piezoelectric ceramic component.

The first internal electrodes 102 are formed in the first region 101g and face the third internal electrodes 104 and the first surface electrode 105 via the piezoelectric ceramic body 101 (see FIGS. 3 and 4). FIG. 9 is a cross-sectional view of the multi-layer piezoelectric ceramic component 100, which shows the first internal electrode 102, and is also a cross-sectional view taken along the line A-A of FIGS. 3 and 4. As shown in FIG. 9, the first internal electrode 102 is drawn to the first end surface 101c, partially exposed at the first end surface 101c, and electrically connected to the first end surface terminal electrode 107.

Further, the first internal electrode 102 has the same width as the width (Y direction) of the piezoelectric ceramic body 101 and is exposed at the first side surface 101a and the second side surface 101b (see FIGS. 3 and 4). The number of first internal electrodes 102 is not particularly limited, and the first internal electrodes 102 may be a single layer or a plurality of layers.

Figure 10:
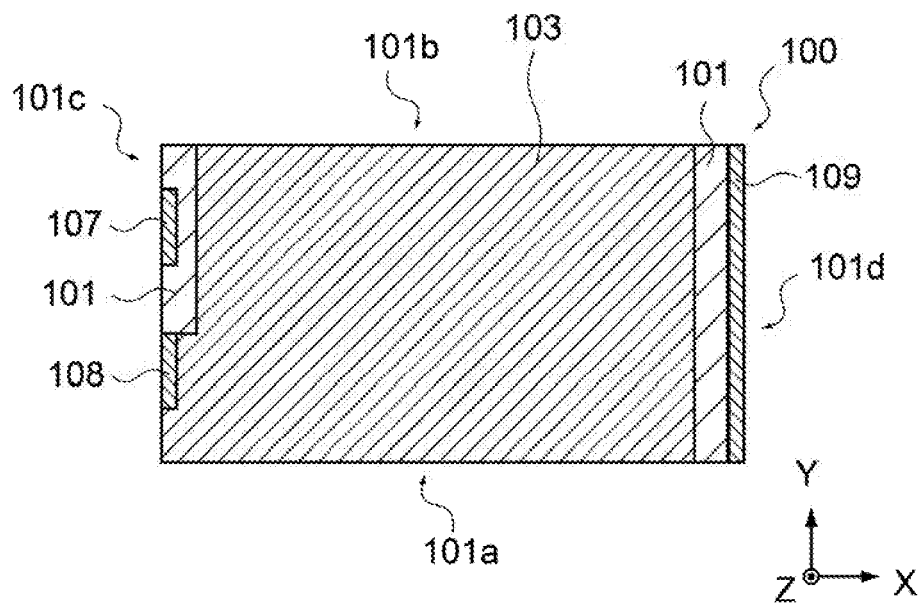
FIG. 10 is a cross-sectional view of a second internal electrode of the multi-layer piezoelectric ceramic component.

The second internal electrodes 103 are formed in the second region 101h and face the third internal electrodes 104 and the second surface electrode 106 via the piezoelectric ceramic body 101 (see FIGS. 3 and 4). FIG. 10 is a cross-sectional view of the multi-layer piezoelectric ceramic component 100, which shows the second internal electrode 103, and is also a cross-sectional view taken along the line B-B of FIGS. 3 and 4. As shown in FIG. 10, the second internal electrode 103 is drawn to the first end surface 101c, partially exposed at the first end surface 101c, and electrically connected to the second end surface terminal electrode 108.

Further, the second internal electrode 103 has the same width as the width (Y direction) of the piezoelectric ceramic body 101 and is exposed at the first side surface 101a and the second side surface 101b (see FIGS. 3 and 4). The number of second internal electrodes 103 is not particularly limited, and the second internal electrodes 103 may be a single layer or a plurality of layers.

The third internal electrodes 104 are formed in the first region 101g and the second region 101h. The third internal electrodes 104 are laminated alternately with the first internal electrodes 102 in the first region 101g at predetermined distances from the respective first internal electrodes 102 in the thickness direction (Z direction) and face the respective first internal electrodes 102 via the piezoelectric ceramic body 101 (see FIGS. 3 and 4).

Further, the third internal electrodes 104 are laminated alternately with the second internal electrodes 103 in the second region 101h at predetermined distances from the respective second internal electrodes 103 in the thickness direction (Z direction) and face the respective second internal electrodes 103 via the piezoelectric ceramic body 101 (see FIGS. 3 and 4).

Figure 11:
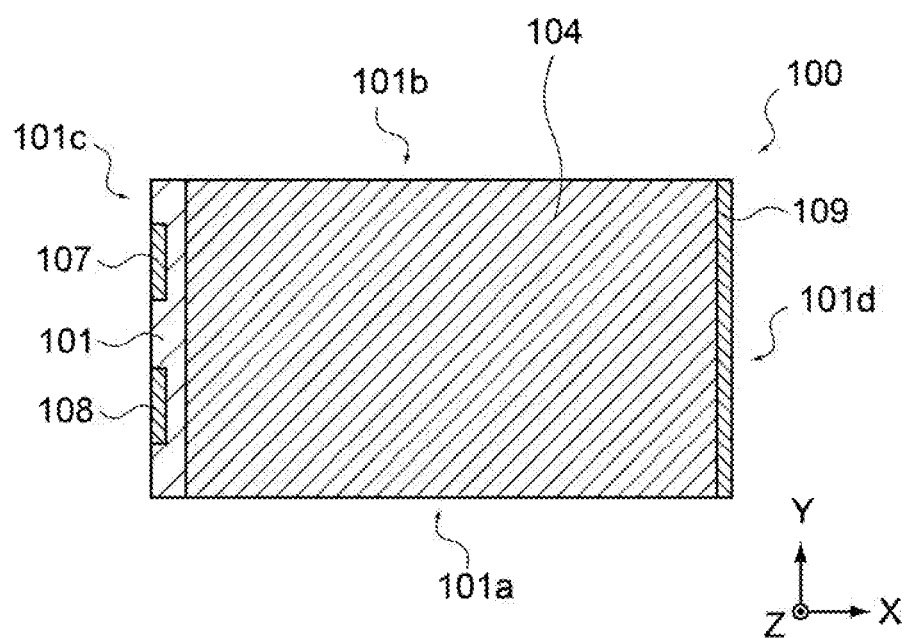
FIG. 11 is a cross-sectional view of a third internal electrode of the multi-layer piezoelectric ceramic component.

FIG. 11 is a cross-sectional view of the multi-layer piezoelectric ceramic component 100, which shows the third internal electrode 104, and is also a cross-sectional view taken along the line C-C of FIGS. 3 and 4. As shown in FIG. 11, the third internal electrode 104 is drawn to the second end surface 101d, exposed at the second end surface 101d, and electrically connected to the third end surface terminal electrode 109.

Further, the third internal electrode 104 has the same width as the width (Y direction) of the piezoelectric ceramic body 101 and is exposed at the first side surface 101a and the second side surface 101b (see FIGS. 3 and 4). The number of third internal electrodes 104 may be set to correspond to the number of first internal electrodes 102 and the number of second internal electrodes 103.

The first surface electrode 105 is formed on the upper surface 101e (see FIG. 1) and is electrically connected to the third end surface terminal electrode 109. Further, the first surface electrode 105 is apart from and electrically insulated from the first surface terminal electrode 110 and the second surface terminal electrode 111 on the upper surface 101e (see FIG. 7).

The second surface electrode 106 is formed on the lower surface 101f and is electrically connected to the third end surface terminal electrode 109 (see FIG. 2).

The first end surface terminal electrode 107 is formed on the first end surface 101c (see FIG. 1) and is electrically connected to the first internal electrodes 102. Further, the first end surface terminal electrode 107 is electrically insulated from the second internal electrodes 103 and the second end surface terminal electrode 108. The first end surface terminal electrode 107 is formed between the upper surface 101e and the lower surface 101f on the first end surface 101c and is electrically connected to the first surface terminal electrode 110.

The second end surface terminal electrode 108 is formed on the first end surface 101c (see FIG. 1) and is electrically connected to the second internal electrodes 103. Further, the second end surface terminal electrode 108 is electrically insulated from the first internal electrodes 102 and the first end surface terminal electrode 107. The second end surface terminal electrode 108 is formed between the upper surface 101e and the lower surface 101f on the first end surface 101c and is electrically connected to the second surface terminal electrode 111.

The third end surface terminal electrode 109 is formed on the second end surface 101d (see FIG. 2) and is electrically connected to the third internal electrodes 104. Further, the third end surface terminal electrode 109 is formed between the upper surface 101e and the lower surface 101f on the second end surface 101d and is electrically connected to the first surface electrode 105 and the second surface electrode 106.

The first surface terminal electrode 110 is formed on the upper surface 101e (see FIG. 1). The first surface terminal electrode 110 is electrically connected to the first end surface terminal electrode 107 and is electrically insulated from the second surface terminal electrode 111 and the first surface electrode 105.

The second surface terminal electrode 111 is formed on the upper surface 101e (see FIG. 1). The second surface terminal electrode 111 is electrically connected to the second end surface terminal electrode 108 and is electrically insulated from the first surface terminal electrode 110 and the first surface electrode 105.

The first internal electrodes 102, the second internal electrodes 103, the third internal electrodes 104, the first surface electrode 105, the second surface electrode 106, the first end surface terminal electrode 107, the second end surface terminal electrode 108, the third end surface terminal electrode 109, the first surface terminal electrode 110, and the second surface terminal electrode 111 are each made of an electrically conductive material. The electrically conductive material may be any one of, for example, Ag, Ag/Pd, Pd, Cu, and Ni.

The multi-layer piezoelectric ceramic component 100 has the configuration as described above. As described above, the first internal electrodes 102, the second internal electrodes 103, and the third internal electrodes 104 are formed in the piezoelectric ceramic body 101, the first internal electrodes 102 and the third internal electrodes 104 face each other via the piezoelectric ceramic body 101, and the second internal electrodes 103 and the third internal electrodes 104 face each other via the piezoelectric ceramic body 101. The first internal electrodes 102, the second internal electrodes 103, and the third internal electrodes 104 are insulated from one another.

The size of the multi-layer piezoelectric ceramic component 100 is not particularly limited, but assuming that the length (X direction) is L and the width (Y direction) is W, it is suitable that L/W is approximately 16 to 50. Further, it is suitable that the thickness (Z direction) is approximately 0.5 mm to 1.5 mm.

Operation of Multi-Layer Piezoelectric Ceramic Component

In the multi-layer piezoelectric ceramic component 100, a voltage can be independently applied between the first internal electrodes 102 and the third internal electrodes 104 and between the second internal electrodes 103 and the third internal electrodes 104.

When a voltage is applied between the first internal electrodes 102 and the third internal electrodes 104, an inverse piezoelectric effect occurs in the piezoelectric ceramic body 101 between the first internal electrodes 102 and the third internal electrodes 104 and causes deformation (expansion and contraction) in the X direction in the first region 101g. Further, when a voltage is applied between the second internal electrodes 103 and the third internal electrodes 104, an inverse piezoelectric effect occurs in the piezoelectric ceramic body 101 between the second internal electrodes 103 and the third internal electrodes 104 and causes deformation (expansion and contraction) in the X direction in the second region 101h.

In such a manner, in the multi-layer piezoelectric ceramic component 100, the deformation in the first region 101g and the deformation in the second region 101h can be independently controlled. The first region 101g and the second region 101h are separately deformed in the X direction, and thus the multi-layer piezoelectric ceramic component 100 can be deformed (bent) in the Z direction.

Figure 12A:
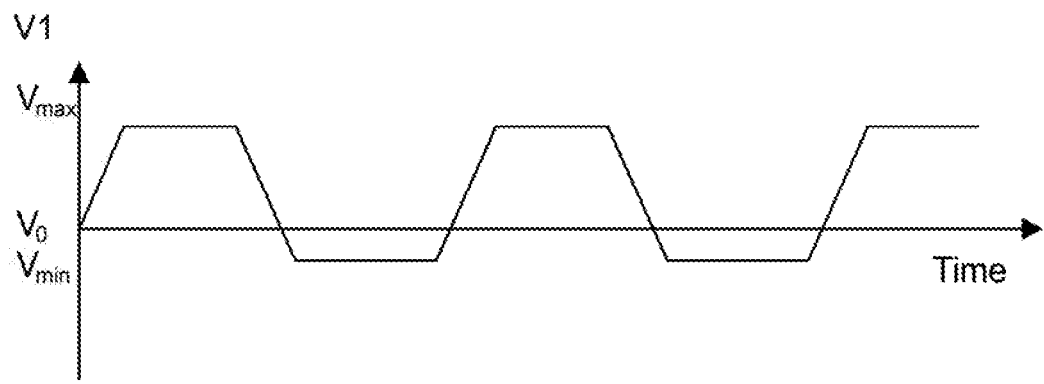
FIGS. 12A and 12B show examples of drive voltage waveforms applied to the multi-layer piezoelectric ceramic component.
Figure 12B:
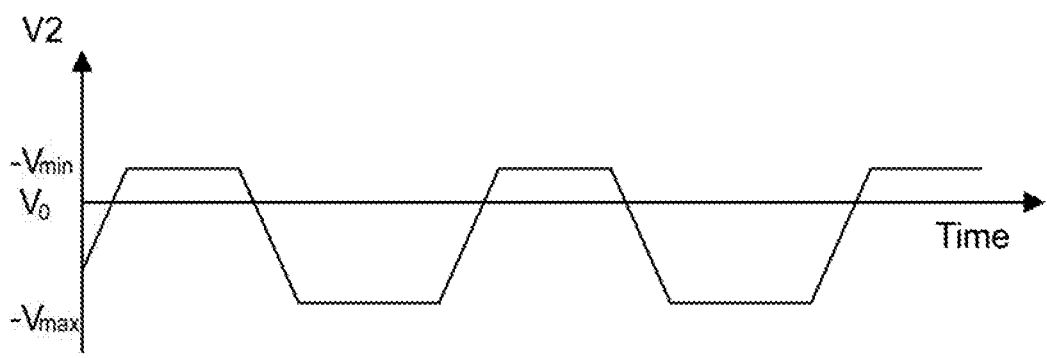

FIGS. 12A and 12B show examples of voltage waveforms applied to the multi-layer piezoelectric ceramic component 100. FIG. 12A shows a waveform of a voltage (V1) applied between the first internal electrodes 102 and the third internal electrodes 104. FIG. 12B shows a waveform of a voltage (V2) applied between the second internal electrodes 103 and the third internal electrodes 104. It should be noted that $V_0$ represents a potential of the third internal electrodes 104. As shown in FIGS. 12A and 12B, when the voltage V1 and the voltage V2 are set as reverse bias voltages in the same phase, one of the first region 101g and the second region 101h can be expanded, and the other one of the first region 101g and the second region 101h can be contracted.

It should be noted that when the thickness of the first region 101g and the thickness of the second region 101h have a ratio of 1:1, the first region 101g and the second region 101h are symmetrical with each other in terms of the amount of deformation, which is suitable. Further, the waveforms of the voltage V1 and the voltage V2 are not limited to those shown in FIGS. 12A and 12B and may be each a sine wave or a triangle wave.

Regarding Structure without Side Margin

As described above, the multi-layer piezoelectric ceramic component 100 has a structure in which the first internal electrodes 102, the second internal electrodes 103, and the third internal electrodes 104 are exposed at the first side surface 101a and the second side surface 101b.

Figure 13:
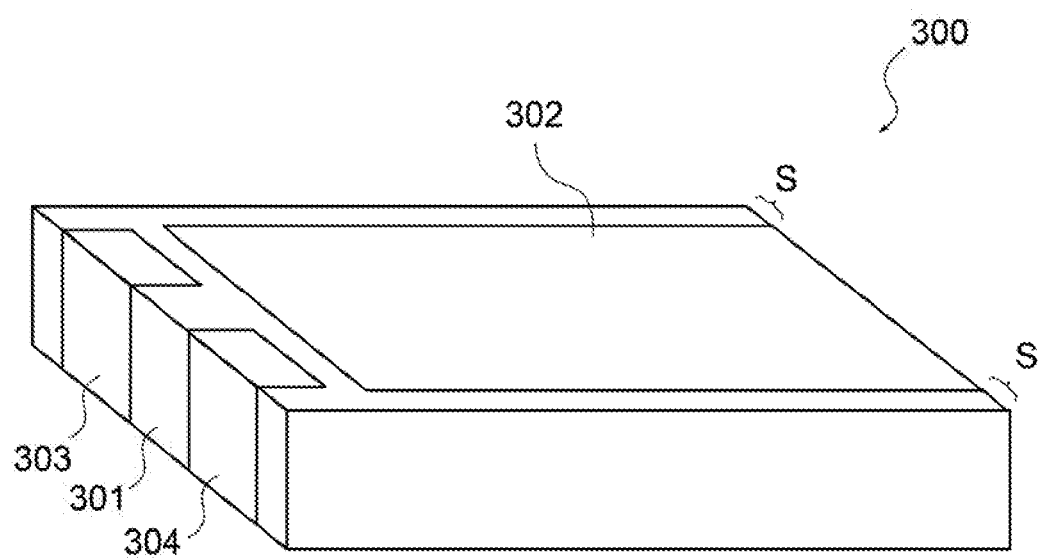
FIG. 13 is a perspective view of a multi-layer piezoelectric ceramic component according to a comparative example.
Figure 13:
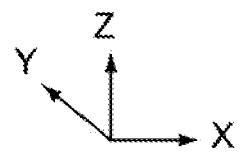

FIG. 13 is a perspective view of a multi-layer piezoelectric ceramic component 300 according to a comparative example.

As shown in FIG. 13, the multi-layer piezoelectric ceramic component 300 includes a piezoelectric ceramic body 301, a surface electrode 302, a first terminal electrode 303, and a second terminal electrode 304. Further, the multi-layer piezoelectric ceramic component 300 includes internal electrodes (not shown) corresponding to the first internal electrodes 102, the second internal electrodes 103, and the third internal electrodes 104.

In the multi-layer piezoelectric ceramic component 300, the internal electrodes are not exposed at the side surfaces and are embedded in the piezoelectric ceramic body 301. As shown in FIG. 13, side margins S made of a piezoelectric material are each provided on the side surface side of the internal electrodes.

The side margins S act as restraint portions that suppress the displacement of the multi-layer piezoelectric ceramic component 300 when the multi-layer piezoelectric ceramic component 300 is driven. This reduces displacement performance of the multi-layer piezoelectric ceramic component 300.

To the contrary, in the multi-layer piezoelectric ceramic component 100, the first internal electrodes 102, the second internal electrodes 103, and the third internal electrodes 104 are exposed at the first side surface 101a and the second side surface 101b, that is, the multi-layer piezoelectric ceramic component 100 does not include side margins. Thus, it is possible to generate large displacement without receiving a restraint effect provided by the side margins and to prevent the displacement performance from being reduced.

Regarding Insulating Film

Figure 14:
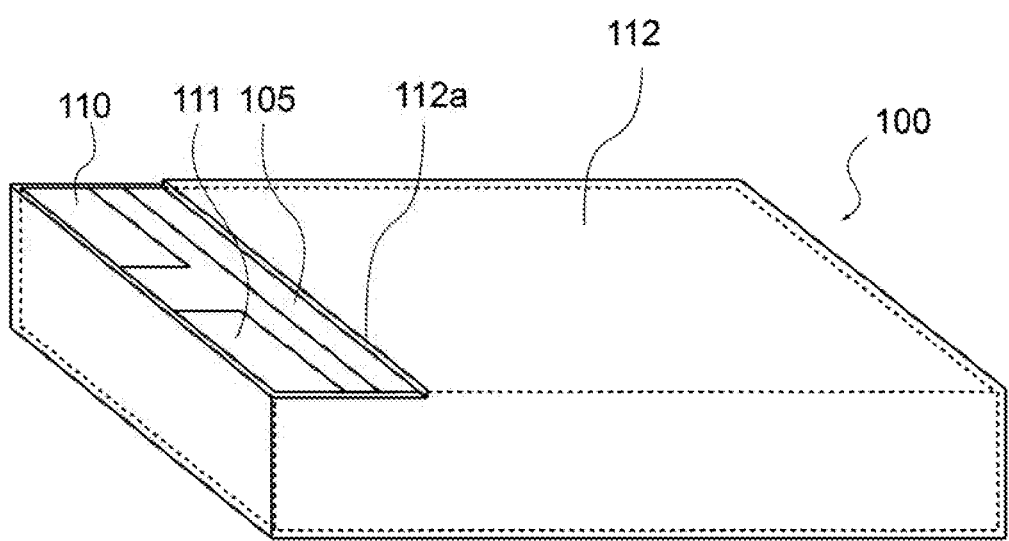
FIG. 14 is a perspective view of the multi-layer piezoelectric ceramic component, which includes an insulating film, according to the first embodiment of the present disclosure.

The multi-layer piezoelectric ceramic component 100 may include an insulating film. FIG. 14 is a perspective view of the multi-layer piezoelectric ceramic component 100 including an insulating film 112.

As shown in FIG. 14, the insulating film 112 covers the outer periphery of the multi-layer piezoelectric ceramic component 100. The insulating film 112 includes an opening 112a from which the first surface terminal electrode 110, the second surface terminal electrode 111, and the first surface electrode 105 are partially exposed. Electrical connection to the first surface terminal electrode 110, the second surface terminal electrode 111, and the first surface electrode 105 via the opening 112a is established.

The range covered with the insulating film 112 is not limited to the range shown in FIG. 14 and only needs to cover at least the first side surface 101a and the second side surface 101b at which the first internal electrodes 102, the second internal electrodes 103, and the third internal electrodes 104 are exposed.

The material of the insulating film 112 is not particularly limited as long as the material is an insulating material. For example, an insulating resin such as a SiN or acrylic resin is suitable. It should be noted that the insulating film 112 is made of a material different from the material of the piezoelectric ceramic body 101, and a soft material can be used therefor. Thus, a restraint effect provided by the insulating film 112 can be made significantly small.

Regarding Production Method

A production method for the multi-layer piezoelectric ceramic component 100 will be described.

Figure 15A:
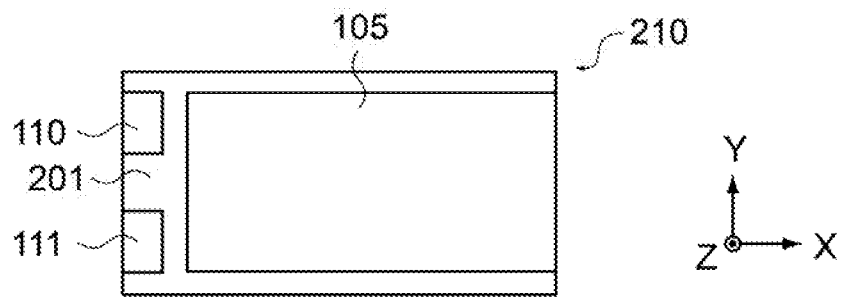
FIGS. 15A to 15E are each a schematic view of a sheet member to be used for producing the multi-layer piezoelectric ceramic component.
Figure 15B:
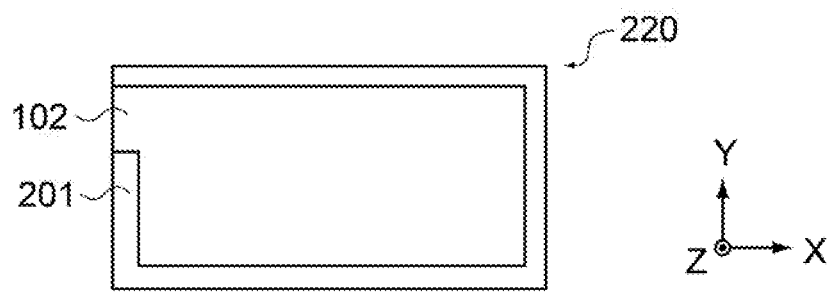

The multi-layer piezoelectric ceramic component 100 can be produced by laminating sheet members. FIGS. 15A to 15E are schematic views of respective sheet members. FIG. 15A shows a sheet member 210 including the first surface electrode 105, the first surface terminal electrode 110, the second surface terminal electrode 111, and a piezoelectric ceramic body 201. FIG. 15B shows a sheet member 220 including the first internal electrode 102 and the piezoelectric ceramic body 201.

Figure 15C:
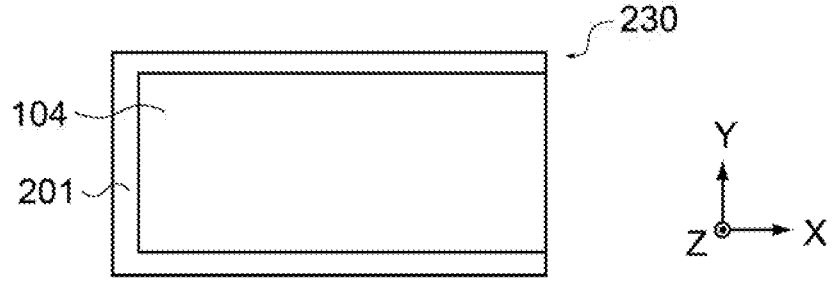
Figure 15D:
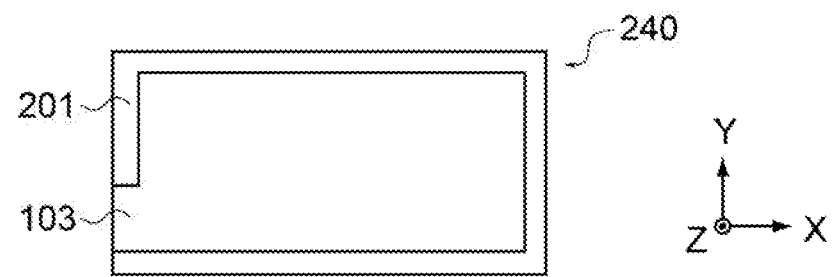
Figure 15E:
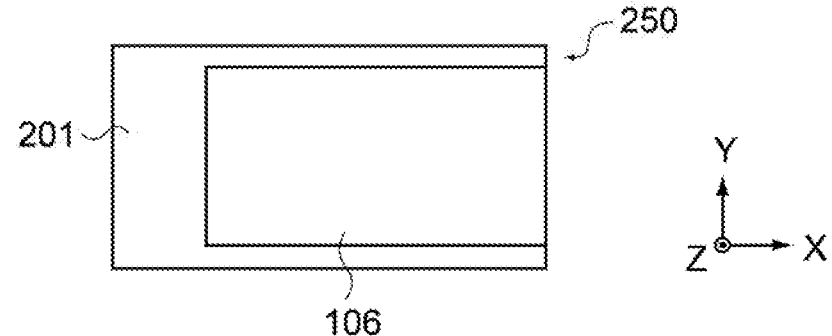

FIG. 15C shows a sheet member 230 including the third internal electrode 104 and the piezoelectric ceramic body 201. FIG. 15D shows a sheet member 240 including the second internal electrode 103 and the piezoelectric ceramic body 201. FIG. 15E shows a sheet member 250 including the second surface electrode 106 and the piezoelectric ceramic body 201.

First, a sheet member including only a piezoelectric ceramic body (hereinafter, referred to as piezoelectric sheet member) is laminated on the sheet member 250, and thereon, the sheet member 240, a piezoelectric sheet member, and the sheet member 230 are laminated in this order. Moreover, the sheet members 240 and the sheet members 230 are alternately laminated via piezoelectric sheet members.

Subsequently, the sheet members 220 and the sheet members 230 are alternately laminated via piezoelectric sheet members, and thereon, a piezoelectric sheet member and the sheet member 210 are laminated in this order. Subsequently, this laminate is pressure-bonded, and a binder is removed by heating or the like.

Subsequently, sintering is performed. At this stage, each internal electrode is embedded in the piezoelectric ceramic body 201, and side margins are formed. Subsequently, by heat treatment, the first end surface terminal electrode 107 and the second end surface terminal electrode 108 are formed on the first end surface 101c, and the third end surface terminal electrode 109 is formed on the second end surface 101d.

Subsequently, the side margins are cut and removed. Accordingly, the piezoelectric ceramic body 101 is formed from the piezoelectric ceramic bodies 201. The cutting of the side margins can be performed by dicing or laser irradiation. When the side margins are cut, the first side surface 101a and the second side surface 101b are formed, and the first internal electrodes 102, the second internal electrodes 103, and the third internal electrodes 104 are exposed at the first side surface 101a and the second side surface 101b (see FIG. 1).

Subsequently, the insulating film 112 including the opening 112a is formed (see FIG. 14). The insulating film 112 can be formed by a method such as mist deposition, sputtering, dipping, or spraying. Subsequently, the first surface terminal electrode 110 and the second surface terminal electrode 111 are electrically connected, and a DC voltage is applied. This causes a polarizing process and activates the piezoelectric ceramic body 101.

The multi-layer piezoelectric ceramic component 100 can be produced as described above. It should be noted that the production method for the multi-layer piezoelectric ceramic component 100 is not limited to the method described herein.

Regarding Piezoelectric Device

Figure 16:
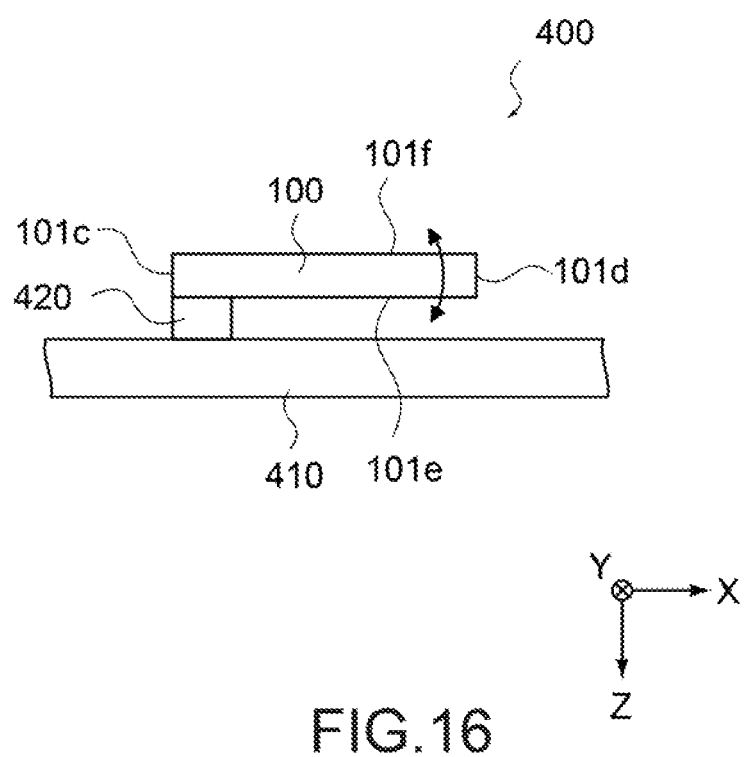
FIG. 16 is a schematic view of a piezoelectric device according to the first embodiment of the present disclosure.

The multi-layer piezoelectric ceramic component 100 can be mounted to a vibration member to configure a piezoelectric device. FIG. 16 is a schematic view of a piezoelectric device 400 including the multi-layer piezoelectric ceramic component 100. As shown in FIG. 16, the piezoelectric device 400 includes the multi-layer piezoelectric ceramic component 100, a vibration member 410, and a joint 420.

The vibration member 410 is a metal plate or a glass panel of a display and is not particularly limited. The joint 420 is made of a resin or the like and joins the multi-layer piezoelectric ceramic component 100 to the vibration member 410.

In the multi-layer piezoelectric ceramic component 100, a region of the upper surface 101e on the first end surface 101c side is joined to the joint 420. Wiring (not shown) is connected to the first surface terminal electrode 110, the second surface terminal electrode 111, and the first surface electrode 105 via the joint 420.

When a voltage is applied to each electrode, as described above, the multi-layer piezoelectric ceramic component 100 is deformed in the Z direction (arrow in FIG. 16). This allows the vibration member 410 to vibrate. It should be noted that the method of mounting the multi-layer piezoelectric ceramic component 100 is not limited to that described herein. For example, the entire upper surface 101e may be joined to the joint 420.

Second Embodiment

A multi-layer piezoelectric ceramic component according to a second embodiment of the present disclosure will be described. In each of the following figures, three directions orthogonal to one another will be assumed as an X direction, a Y direction, and a Z direction.

Configuration of Multi-Layer Piezoelectric Ceramic Component

Figure 17:
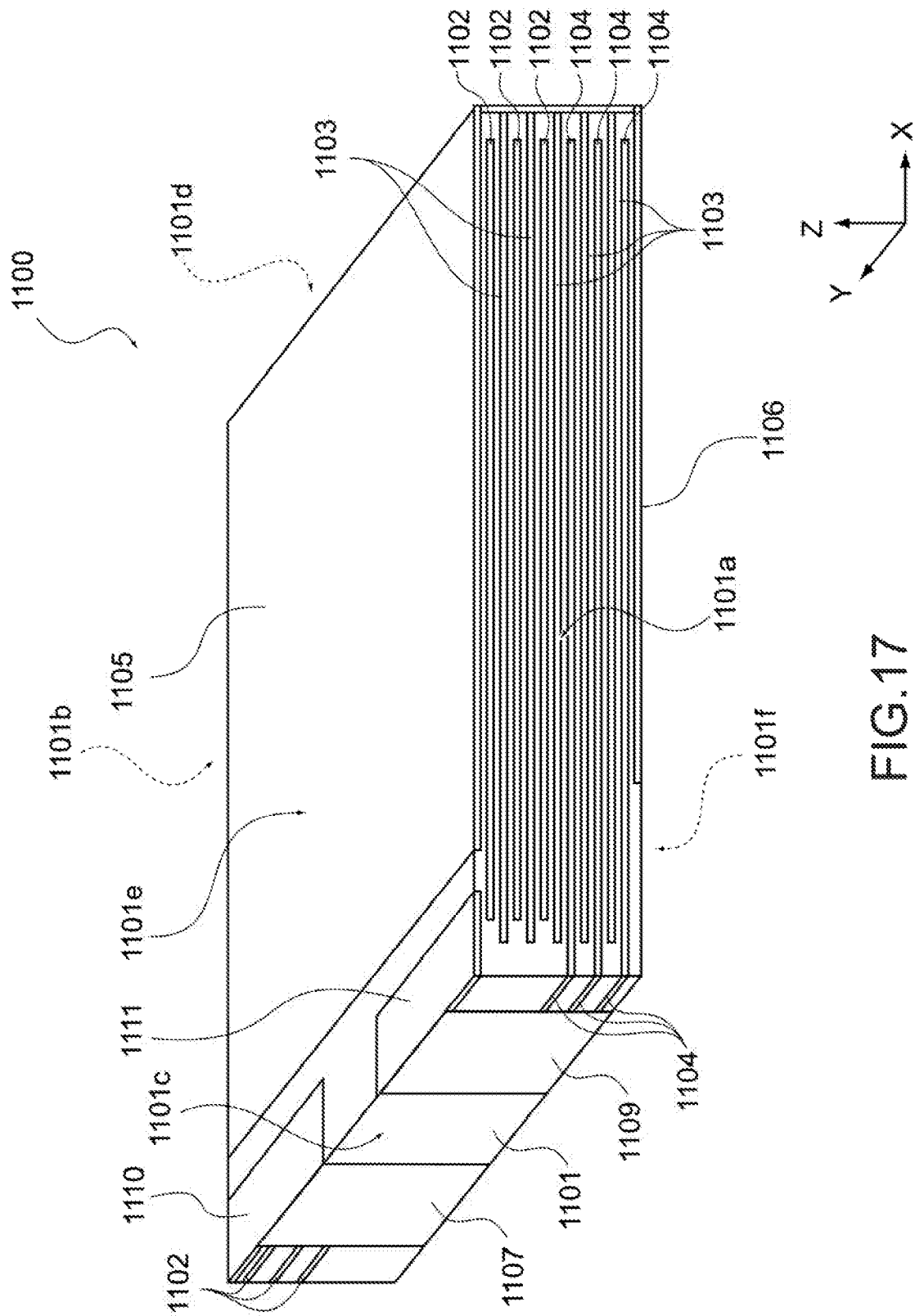
FIG. 17 is a perspective view of a multi-layer piezoelectric ceramic component according to a second embodiment of the present disclosure.
Figure 18:
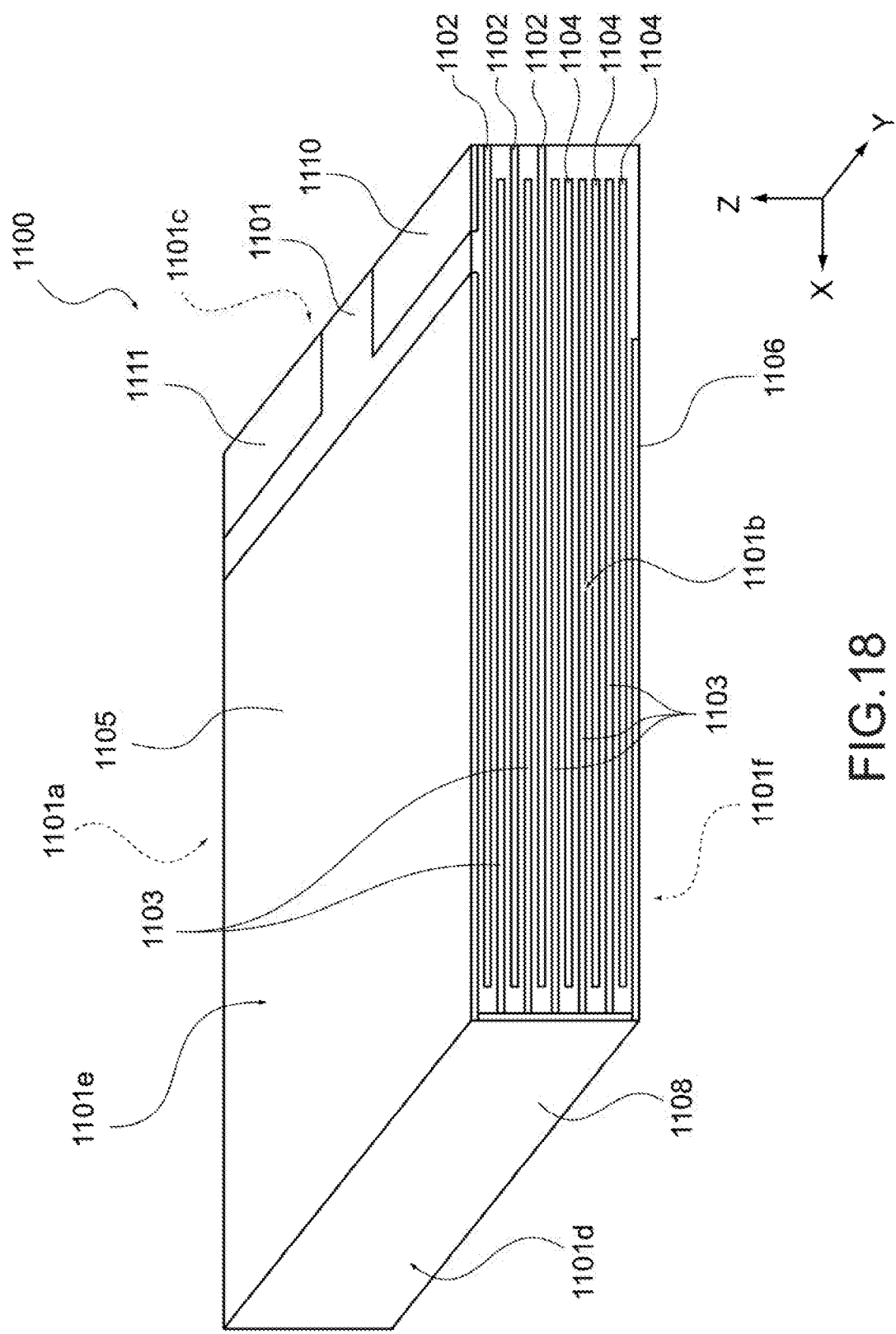
FIG. 18 is a perspective view of the multi-layer piezoelectric ceramic component.

FIGS. 17 and 18 are each a perspective view of a multi-layer piezoelectric ceramic component 1100 according to the second embodiment. FIG. 18 is a view of the opposite side from FIG. 17.

As shown in FIGS. 17 and 18, the multi-layer piezoelectric ceramic component 1100 includes a piezoelectric ceramic body 1101, first internal electrodes 1102, second internal electrodes 1103, third internal electrodes 1104, a first surface electrode 1105, a second surface electrode 1106, a first end surface terminal electrode 1107, a second end surface terminal electrode 1108, a third end surface terminal electrode 1109, a first surface terminal electrode 1110, and a second surface terminal electrode 1111.

The piezoelectric ceramic body 1101 is made of a piezoelectric ceramic material. The piezoelectric ceramic body 1101 may be made of, for example, lithium niobate ($LiNbO_3$), lithium tantalite ($LiTaO_3$), or lead zirconate titanate ($PbZrO_3$—$PbTiO_3$).

As shown in FIGS. 17 and 18, the piezoelectric ceramic body 1101 has a cuboid shape. Assuming that the X direction is a length, the Y direction is a width, and the Z direction is a thickness, the piezoelectric ceramic body 1101 has such a shape that the length is larger than the width and the width is larger than the thickness (length>width>thickness).

For the surfaces of the piezoelectric ceramic body 1101, surfaces facing in the width direction (Y direction) are assumed as a first side surface 1101a and a second side surface 1101b, and surfaces facing in the length direction (X direction) are assumed as a first end surface 1101c and a second end surface 1101d. Further, surfaces facing in the thickness direction (Z direction) are assumed as an upper surface 1101e and a lower surface 1101f.

Figure 19:
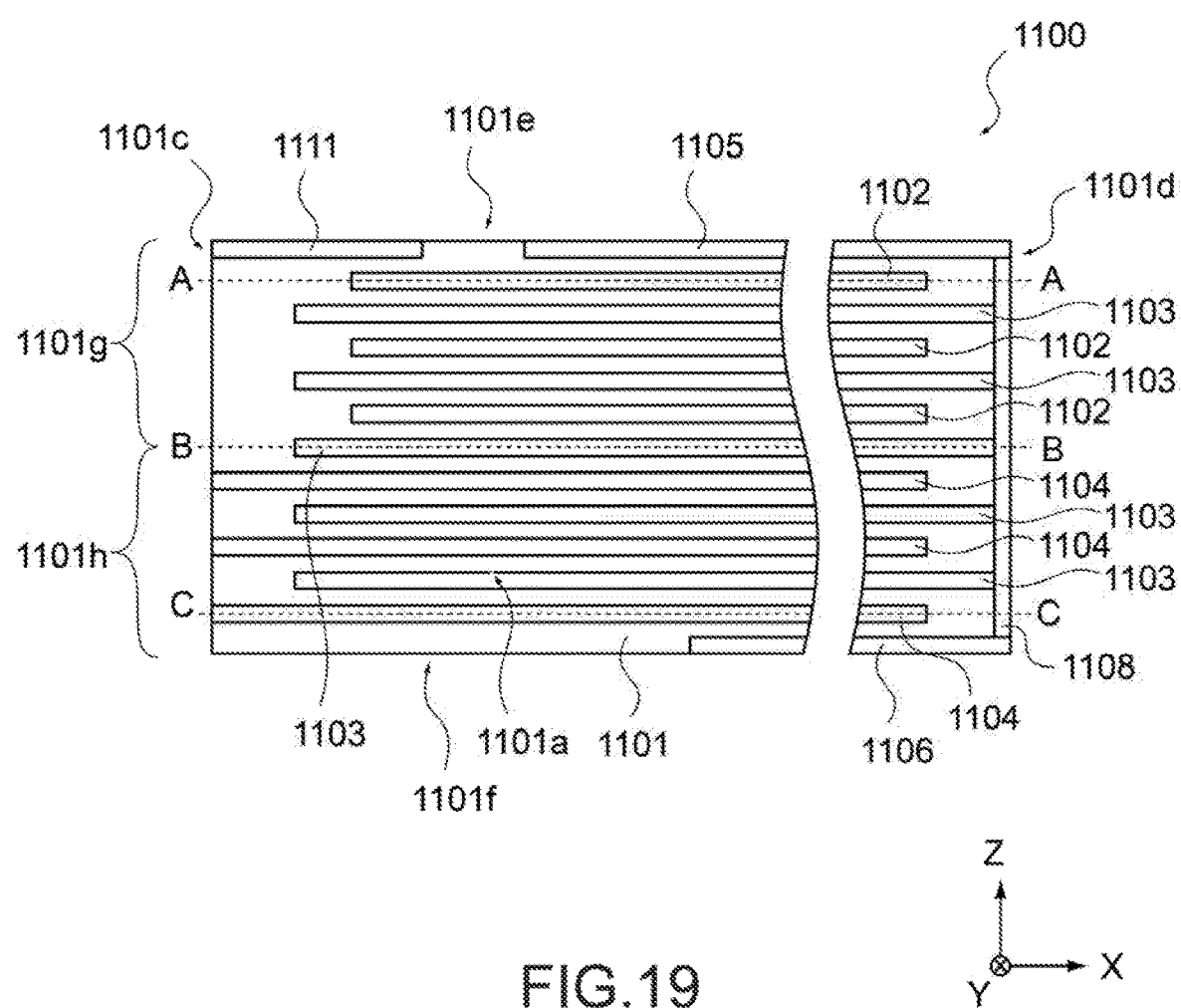
FIG. 19 is a plan view of a first side surface of the multi-layer piezoelectric ceramic component.
Figure 20:
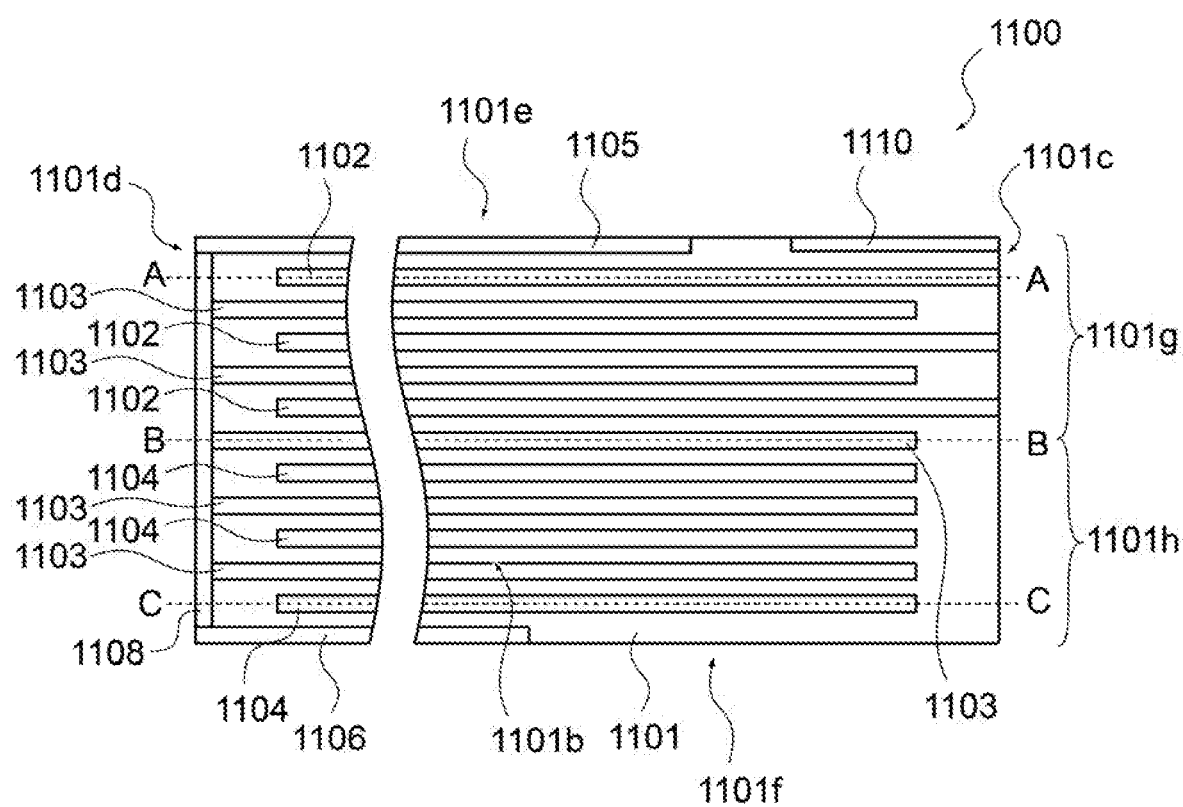
FIG. 20 is a plan view of a second side surface of the multi-layer piezoelectric ceramic component.
Figure 21:
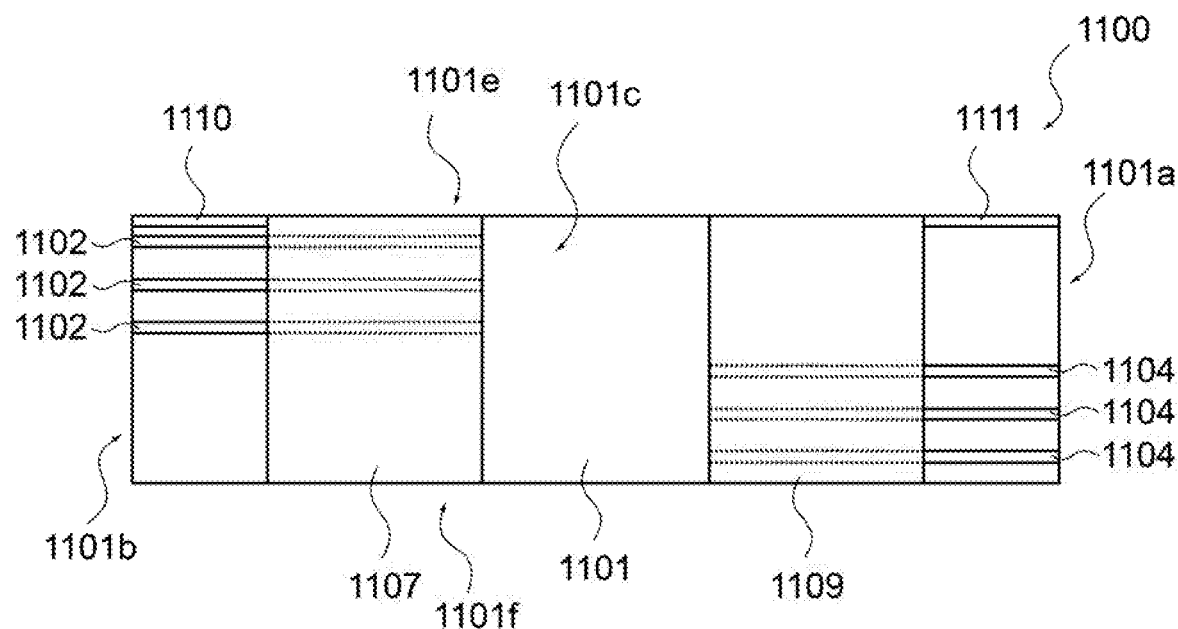
FIG. 21 is a plan view of a first end surface of the multi-layer piezoelectric ceramic component.
Figure 22:
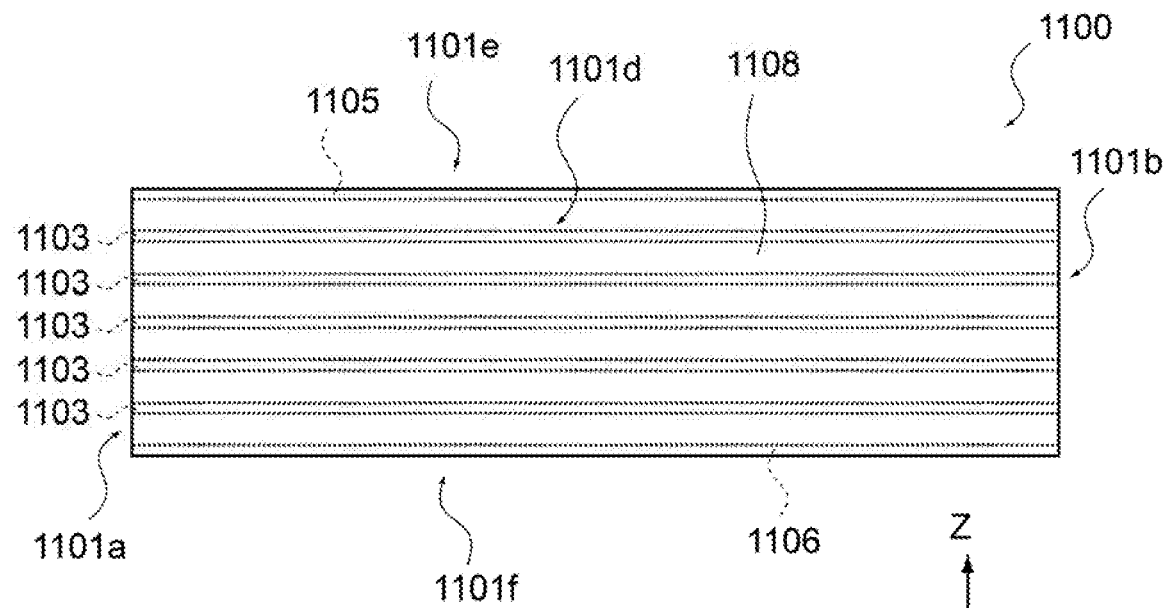
FIG. 22 is a plan view of a second end surface of the multi-layer piezoelectric ceramic component.
Figure 23:
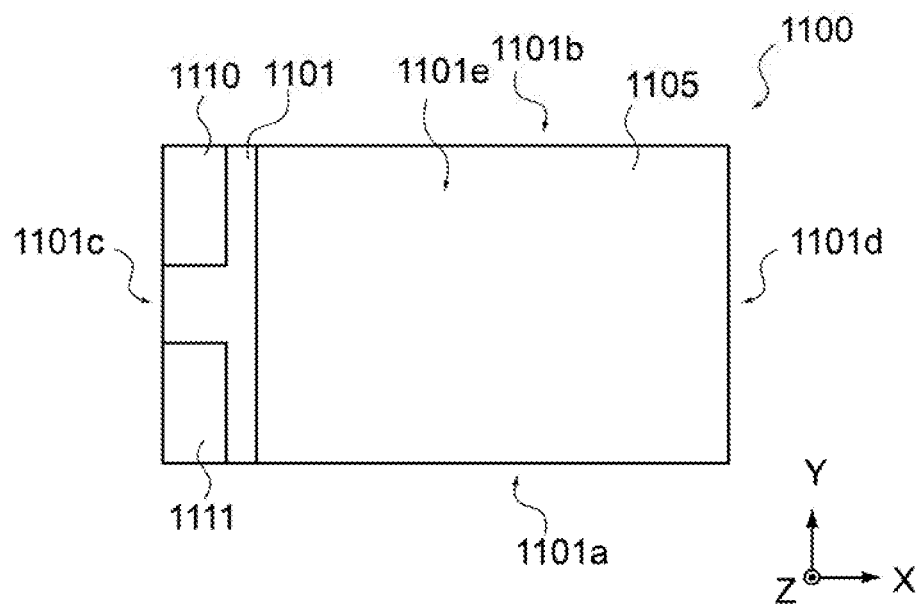
FIG. 23 is a plan view of an upper surface of the multi-layer piezoelectric ceramic component.
Figure 24:
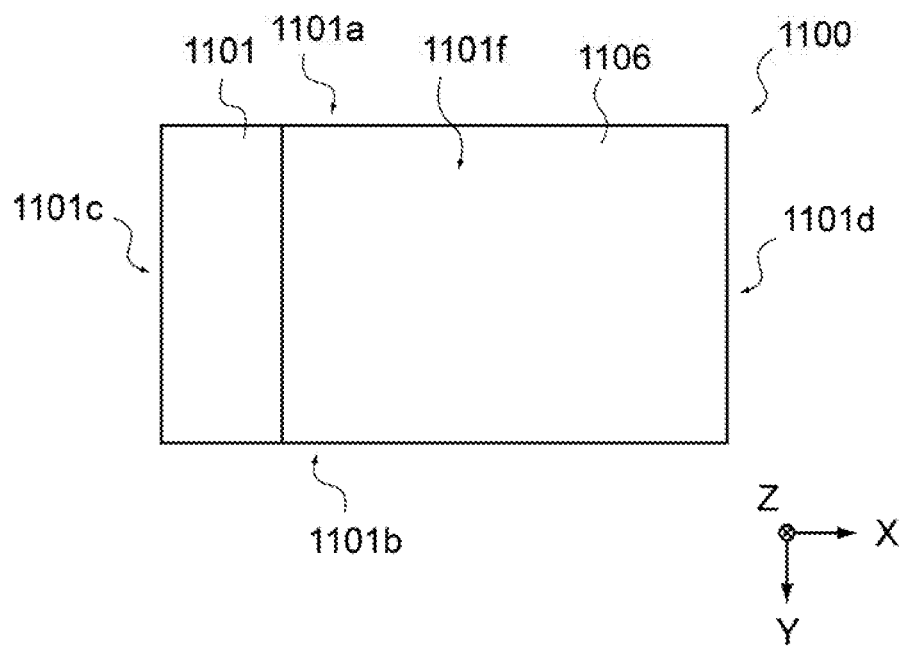
FIG. 24 is a plan view of a lower surface of the multi-layer piezoelectric ceramic component.

FIG. 19 is a plan view of the first side surface 1101a. FIG. 20 is a plan view of the second side surface 1101b. FIG. 21 is a plan view of the first end surface 1101c. FIG. 22 is a plan view of the second end surface 1101d. FIG. 23 is a plan view of the upper surface 1101e. FIG. 24 is a plan view of the lower surface 1101f.

As shown in FIGS. 19 and 20, the piezoelectric ceramic body 1101 includes a first region 1101g on the upper surface 1101e side and a second region 1101h on the lower surface 1101f side. The thickness of the first region 1101g and the thickness of the second region 1101h suitably have a ratio of 1:1.

Figure 25:
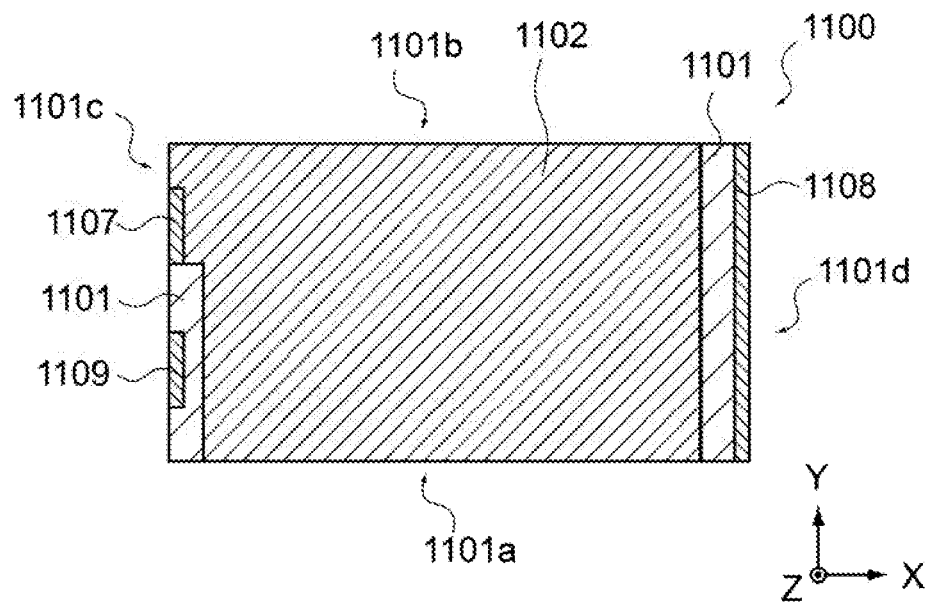
FIG. 25 is a cross-sectional view of a first internal electrode of the multi-layer piezoelectric ceramic component.

The first internal electrodes 1102 are formed in the first region 1101g and face the second internal electrodes 1103 and the first surface electrode 1105 via the piezoelectric ceramic body 1101 (see FIGS. 19 and 20). FIG. 25 is a cross-sectional view of the multi-layer piezoelectric ceramic component 1100, which shows the first internal electrode 1102, and is also a cross-sectional view taken along the line A-A of FIGS. 19 and 20. As shown in FIG. 25, the first internal electrode 1102 is drawn to the first end surface 1101c, partially exposed at the first end surface 1101c, and electrically connected to the first end surface terminal electrode 1107.

Further, the first internal electrode 1102 has the same width as the width (Y direction) of the piezoelectric ceramic body 1101 and is exposed at the first side surface 1101a and the second side surface 1101b (see FIGS. 19 and 20). The number of first internal electrodes 1102 is not particularly limited, and the first internal electrodes 1102 may be a single layer or a plurality of layers.

The second internal electrodes 1103 are formed in the first region 1101g and the second region 1101h. The second internal electrodes 1103 are laminated alternately with the first internal electrodes 1102 in the first region 1101g at predetermined distances from the respective first internal electrodes 1102 in the thickness direction (Z direction) and face the respective first internal electrodes 1102 via the piezoelectric ceramic body 1101 (see FIGS. 19 and 20).

Further, the second internal electrodes 1103 are laminated alternately with the third internal electrodes 1104 in the second region 1101h at predetermined distances from the respective third internal electrodes 1104 in the thickness direction (Z direction) and face the respective third internal electrodes 1104 via the piezoelectric ceramic body 1101 (see FIGS. 19 and 20).

Figure 26:
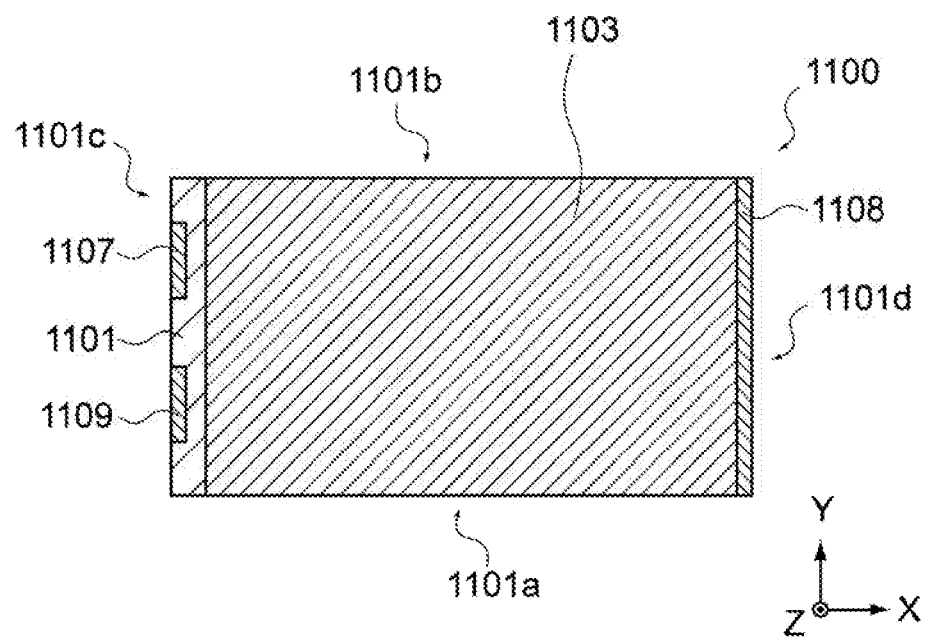
FIG. 26 is a cross-sectional view of a second internal electrode of the multi-layer piezoelectric ceramic component.

FIG. 26 is a cross-sectional view of the multi-layer piezoelectric ceramic component 1100, which shows the second internal electrode 1103, and is also a cross-sectional view taken along the line B-B of FIGS. 19 and 20. As shown in FIG. 26, the second internal electrode 1103 is drawn to the second end surface 1101d and electrically connected to the second end surface terminal electrode 1108.

Further, the second internal electrode 1103 has the same width as the width (Y direction) of the piezoelectric ceramic body 1101 and is exposed at the first side surface 1101a and the second side surface 1101b (see FIGS. 19 and 20). The number of second internal electrodes 1103 may be set to correspond to the number of first internal electrodes 1102 and the number of third internal electrodes 1104.

Figure 27:
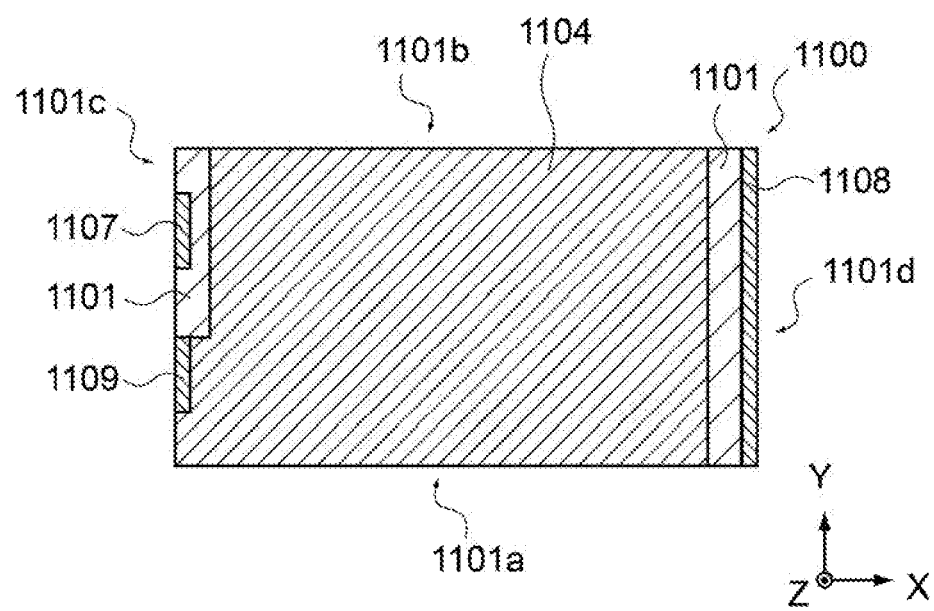
FIG. 27 is a cross-sectional view of a third internal electrode of the multi-layer piezoelectric ceramic component.

The third internal electrodes 1104 are formed in the second region 1101h and face the second internal electrodes 1103 and the second surface electrode 1106 via the piezoelectric ceramic body 1101 (see FIGS. 19 and 20). FIG. 27 is a cross-sectional view of the multi-layer piezoelectric ceramic component 1100, which shows the third internal electrode 1104, and is also a cross-sectional view taken along the line C-C of FIGS. 19 and 20. As shown in FIG. 27, the third internal electrode 1104 is drawn to the first end surface 1101c, partially exposed at the first end surface 1101c, and electrically connected to the third end surface terminal electrode 1109.

Further, the third internal electrode 1104 has the same width as the width (Y direction) of the piezoelectric ceramic body 1101 and is exposed at the first side surface 1101a and the second side surface 1101b (see FIGS. 19 and 20). The number of third internal electrodes 1104 is not particularly limited, and the third internal electrodes 1104 may be a single layer or a plurality of layers.

The first surface electrode 1105 is formed on the upper surface 1101e (see FIG. 17) and is electrically connected to the second end surface terminal electrode 1108. Further, the first surface electrode 1105 is apart from and electrically insulated from the first surface terminal electrode 1110 and the second surface terminal electrode 1111 on the upper surface 1101e (see FIG. 23).

The second surface electrode 1106 is formed on the lower surface 1101f and is electrically connected to the second end surface terminal electrode 1108 (see FIG. 19).

The first end surface terminal electrode 1107 is formed on the first end surface 1101c (see FIG. 17) and is electrically connected to the first internal electrodes 1102. Further, the first end surface terminal electrode 1107 is electrically insulated from the third internal electrodes 1104 and the third end surface terminal electrode 1109. The first end surface terminal electrode 1107 is formed between the upper surface 1101e and the lower surface 1101f on the first end surface 1101c and is electrically connected to the first surface terminal electrode 1110.

The second end surface terminal electrode 1108 is formed on the second end surface 1101d (see FIG. 18) and is electrically connected to the second internal electrodes 1103. Further, the second end surface terminal electrode 1108 is formed between the upper surface 1101e and the lower surface 1101f on the second end surface 1101d and is electrically connected to the first surface electrode 1105 and the second surface electrode 1106.

The third end surface terminal electrode 1109 is formed on the first end surface 1101c (see FIG. 17) and is electrically connected to the third internal electrodes 1104. Further, the third end surface terminal electrode 1109 is electrically insulated from the first internal electrodes 1102 and the first end surface terminal electrode 1107. The third end surface terminal electrode 1109 is formed between the upper surface 1101e and the lower surface 1101f on the first end surface 1101c and is electrically connected to the second surface terminal electrode 1111.

The first surface terminal electrode 1110 is formed on the upper surface 1101e (see FIG. 17). The first surface terminal electrode 1110 is electrically connected to the first end surface terminal electrode 1107 and is electrically insulated from the second surface terminal electrode 1111 and the first surface electrode 1105.

The second surface terminal electrode 1111 is formed on the upper surface 1101e (see FIG. 17). The second surface terminal electrode 1111 is electrically connected to the third end surface terminal electrode 1109 and is electrically insulated from the first surface terminal electrode 1110 and the first surface electrode 1105.

The first internal electrodes 1102, the second internal electrodes 1103, the third internal electrodes 1104, the first surface electrode 1105, the second surface electrode 1106, the first end surface terminal electrode 1107, the second end surface terminal electrode 1108, the third end surface terminal electrode 1109, the first surface terminal electrode 1110, and the second surface terminal electrode 1111 are each made of an electrically conductive material. The electrically conductive material may be any one of, for example, Ag, Ag/Pd, Pd, Cu, and Ni.

The multi-layer piezoelectric ceramic component 1100 has the configuration as described above. As described above, the first internal electrodes 1102, the second internal electrodes 1103, and the third internal electrodes 1104 are formed in the piezoelectric ceramic body 1101, the first internal electrodes 1102 and the third internal electrodes 1103 face each other via the piezoelectric ceramic body 1101, and the third internal electrodes 1104 and the second internal electrodes 1103 face each other via the piezoelectric ceramic body 1101. The first internal electrodes 1102, the second internal electrodes 1103, and the third internal electrodes 1104 are insulated from one another.

The size of the multi-layer piezoelectric ceramic component 1100 is not particularly limited, but assuming that the length (X direction) is L and the width (Y direction) is W, it is suitable that L/W is approximately 16 to 50. Further, it is suitable that the thickness (Z direction) is approximately 0.5 mm to 1.5 mm.

Regarding First End Surface

As described above, the first internal electrodes 1102 and the third internal electrodes 1104 are drawn to the first end surface 1101c and are connected to the first end surface terminal electrode 1107 and the third end surface terminal electrode 1109, respectively.

Figure 28:
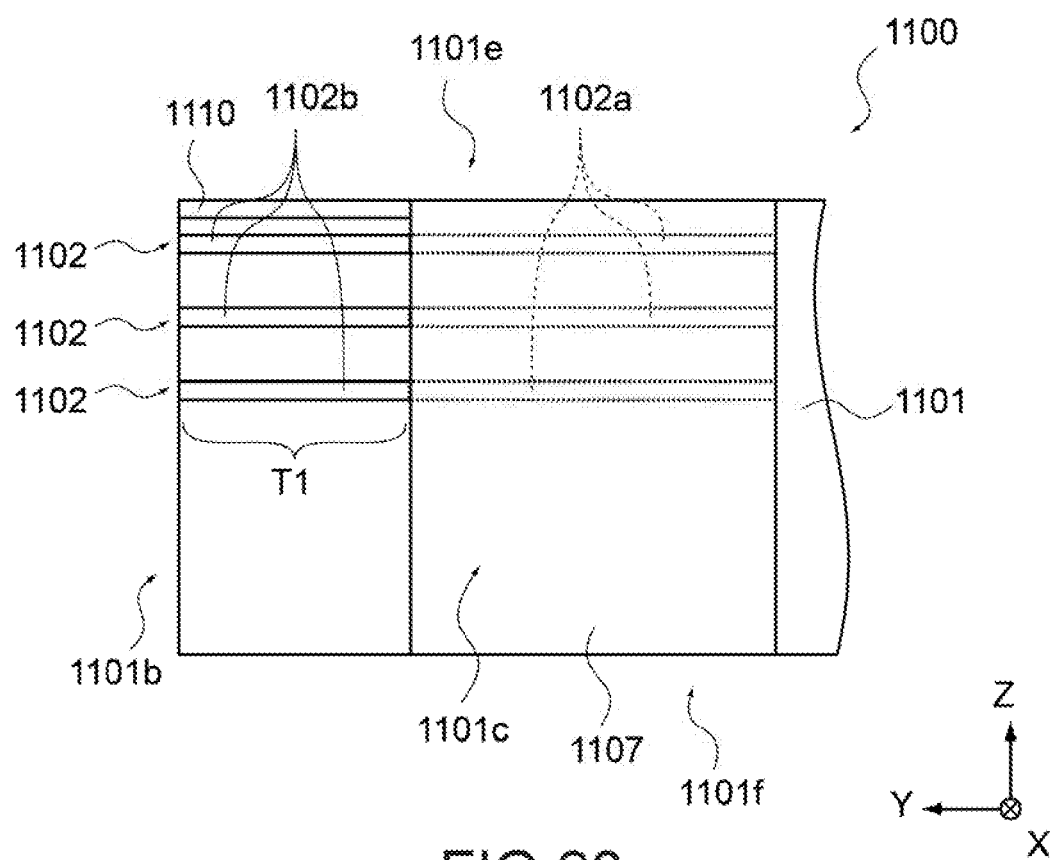
FIG. 28 is an enlarged view of the first end surface of the multi-layer piezoelectric ceramic component.

FIG. 28 is a plan view of the first internal electrodes 1102 and the first end surface terminal electrode 1107 on the first end surface 1101c and is also a partially enlarged view of FIG. 21. As shown in FIG. 28, each of the first internal electrodes 1102 includes a covered portion 1102a and an exposed portion 1102b on the first end surface 1101c.

The covered portion 1102a is a portion covered by the first end surface terminal electrode 1107. The exposed portion 1102b is a portion that is not covered by the first end surface terminal electrode 1107 and is exposed at the first end surface 1101c. The exposed portion 1102b is positioned on the second side surface 1101b side with respect to the covered portion 1102a.

The length of the exposed portion 1102b on the first end surface 1101c (T1 in the figure) is suitably 50 μm or more, and is more suitably 100 μm or more.

Figure 29:
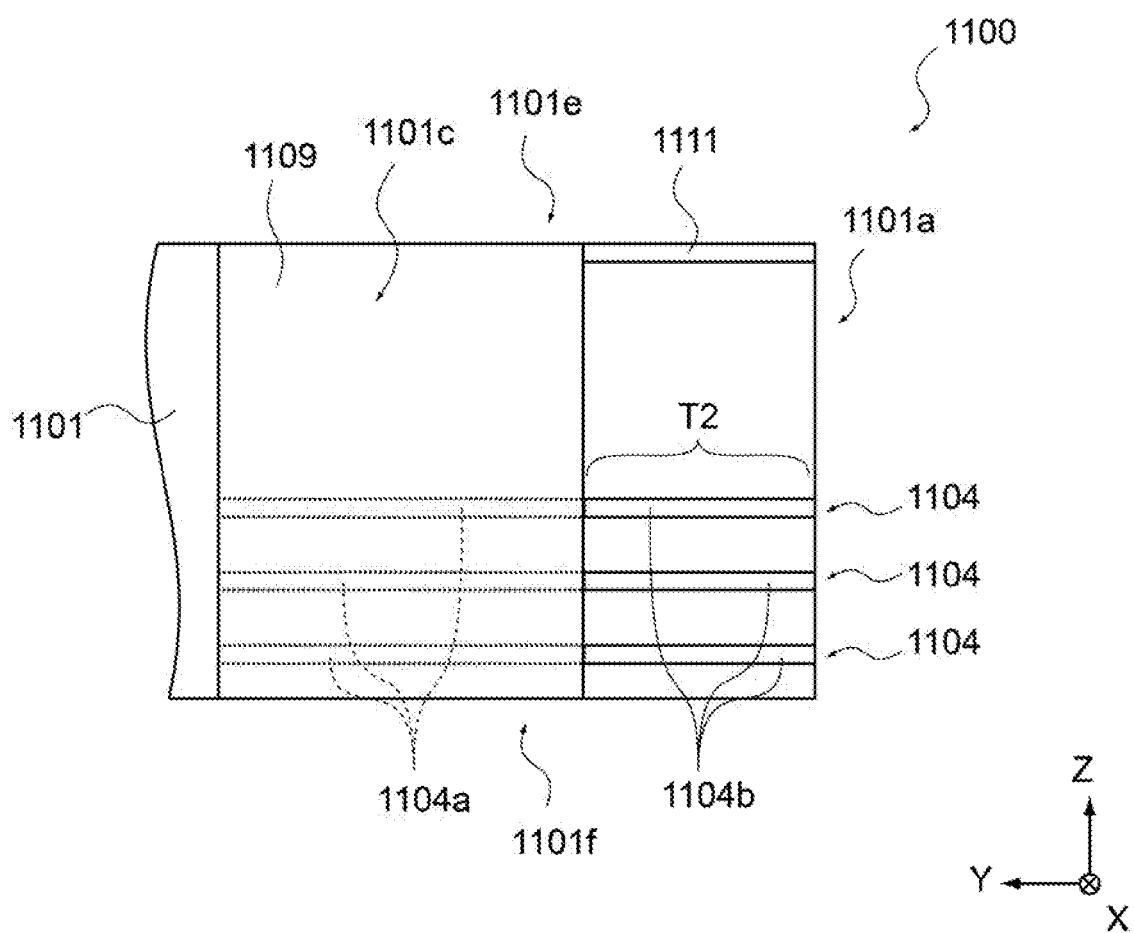
FIG. 29 is another enlarged view of the first end surface of the multi-layer piezoelectric ceramic component.

FIG. 29 is a plan view of the third internal electrodes 1104 and the third end surface terminal electrode 1109 on the first end surface 1101c and is also a partially enlarged view of FIG. 21. As shown in FIG. 29, each of the third internal electrodes 1104 includes a covered portion 1104a and an exposed portion 1104b on the first end surface 1101c.

The covered portion 1104a is a portion covered by the third end surface terminal electrode 1109. The exposed portion 1104b is a portion that is not covered by the third end surface terminal electrode 1109 and is exposed at the first end surface 1101c. The exposed portion 1104b is positioned on the first side surface 1101a side with respect to the covered portion 1104a.

The length of the exposed portion 1104b on the first end surface 1101c (T2 in the figure) is suitably 50 μm or more, and is more suitably 100 μm or more.

Operation of Multi-layer Piezoelectric Ceramic Component

In the multi-layer piezoelectric ceramic component 1100, a voltage can be independently applied between the first internal electrodes 1102 and the second internal electrodes 1103 and between the third internal electrodes 1104 and the second internal electrodes 1103.

When a voltage is applied between the first internal electrodes 1102 and the second internal electrodes 1103, an inverse piezoelectric effect occurs in the piezoelectric ceramic body 1101 between the first internal electrodes 1102 and the second internal electrodes 1103 and causes deformation (expansion and contraction) in the X direction in the first region 1101g. Further, when a voltage is applied between the third internal electrodes 1104 and the second internal electrodes 1103, an inverse piezoelectric effect occurs in the piezoelectric ceramic body 1101 between the third internal electrodes 1104 and the second internal electrodes 1103 and causes deformation (expansion and contraction) in the X direction in the second region 1101h.

In such a manner, in the multi-layer piezoelectric ceramic component 1100, the deformation in the first region 1101g and the deformation in the second region 1101h can be independently controlled. The first region 1101g and the second region 1101h are separately deformed in the X direction, and thus the multi-layer piezoelectric ceramic component 1100 can be deformed (bent) in the Z direction.

Figure 30A:
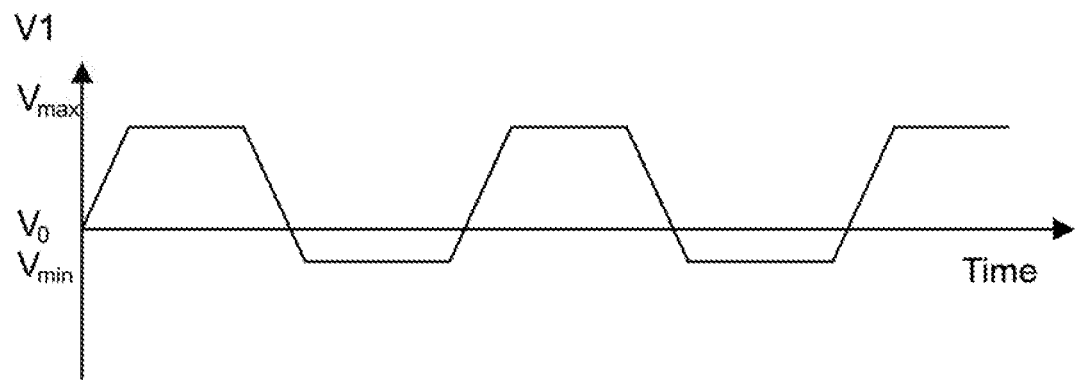
FIGS. 30A and 30B show examples of drive voltage waveforms applied to the multi-layer piezoelectric ceramic component.
Figure 30B:
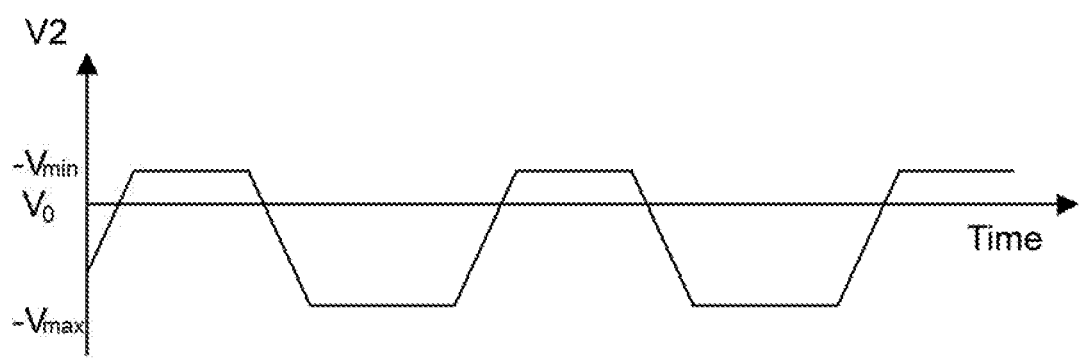

FIGS. 30A and 30B show examples of voltage waveforms applied to the multi-layer piezoelectric ceramic component 1100. FIG. 30A shows a waveform of a voltage (V1) applied between the first internal electrodes 1102 and the second internal electrodes 1103. FIG. 30B shows a waveform of a voltage (V2) applied between the third internal electrodes 1104 and the second internal electrodes 1103. It should be noted that $V_0$ represents a potential of the second internal electrodes 1103. As shown in FIGS. 30A and 30B, when the voltage V1 and the voltage V2 are set as reverse bias voltages in the same phase, one of the first region 1101g and the second region 1101h can be expanded, and the other one of the first region 1101g and the second region 1101h can be contracted.

It should be noted that when the thickness of the first region 1101g and the thickness of the second region 1101h have a ratio of 1:1, the first region 1101g and the second region 1101h are symmetrical with each other in terms of the amount of deformation, which is suitable. Further, the waveforms of the voltage V1 and the voltage V2 are not limited to those shown in FIGS. 30A and 30B and may be each a sine wave or a triangle wave.

Regarding Structure without Side Margin

As described above, the multi-layer piezoelectric ceramic component 1100 has a structure in which the first internal electrodes 1102, the second internal electrodes 1103, and the third internal electrodes 1104 are exposed at the first side surface 1101a and the second side surface 1101b.

Figure 31:
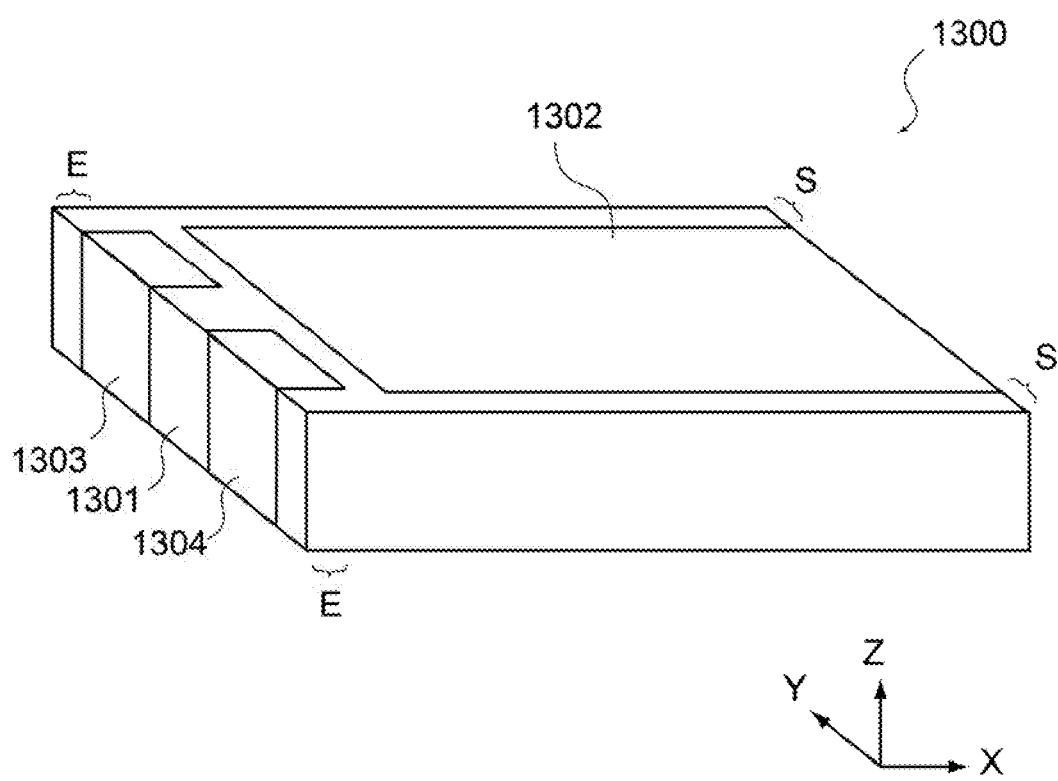
FIG. 31 is a perspective view of a multi-layer piezoelectric ceramic component according to another comparative example.

FIG. 31 is a perspective view of a multi-layer piezoelectric ceramic component 1300 according to a comparative example.

As shown in FIG. 31, the multi-layer piezoelectric ceramic component 1300 includes a piezoelectric ceramic body 1301, a surface electrode 1302, a first terminal electrode 1303, and a second terminal electrode 1304. Further, the multi-layer piezoelectric ceramic component 1300 includes internal electrodes (not shown) corresponding to the first internal electrodes 1102, the second internal electrodes 1103, and the third internal electrodes 1104.

In the multi-layer piezoelectric ceramic component 1300, the internal electrodes are not exposed at the side surfaces and end surfaces and are embedded in the piezoelectric ceramic body 1301. As shown in FIG. 31, side margins S made of a piezoelectric material are each provided on the side surface side of the internal electrodes, and end margins E made of a piezoelectric material are each provided on the end surface side of the internal electrodes.

The side margins S and the end margins E act as restraint portions that suppress the displacement of the multi-layer piezoelectric ceramic component 1300 when the multi-layer piezoelectric ceramic component 1300 is driven. This reduces displacement performance of the multi-layer piezoelectric ceramic component 1300.

To the contrary, the multi-layer piezoelectric ceramic component 1100 does not include side margins and end margins. Thus, it is possible to generate large displacement without receiving a restraint effect provided by the side margins and the end margins and to prevent the displacement performance from being reduced.

Moreover, in the multi-layer piezoelectric ceramic component 1100, the first internal electrodes 1102 and the third internal electrodes 1104 are extended from the first end surface 1101c to the first side surface 1101a or the second side surface 1101b (see FIG. 17). This can mitigate the influence of stress, resulting in increasing the amount of displacement and improving the strength of the element.

Regarding Detection of Connection Failure

Figure 32:
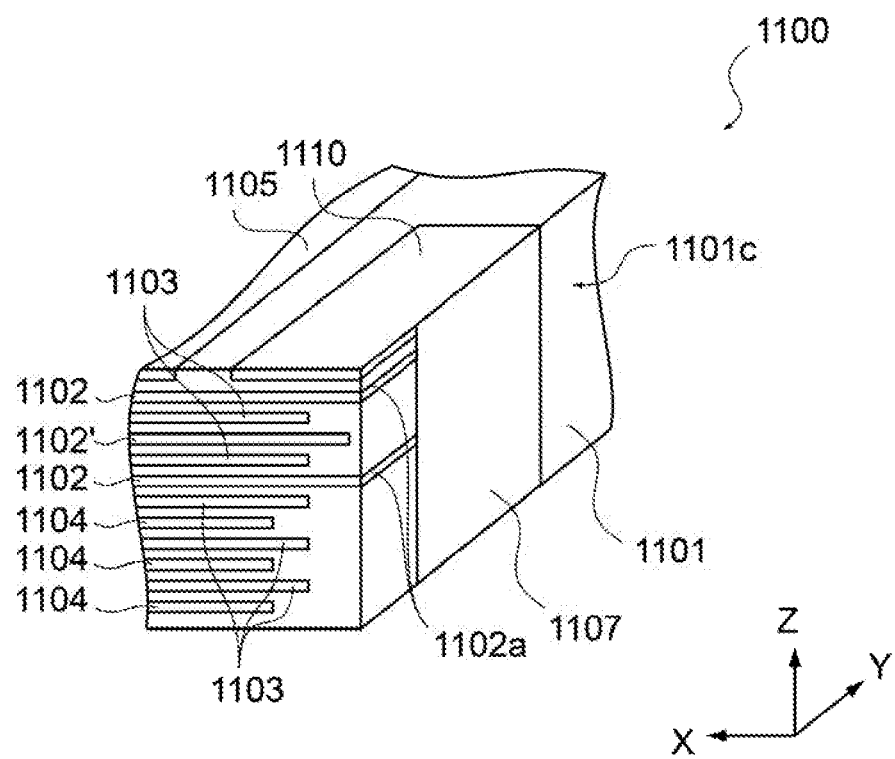
FIG. 32 is a perspective view of the multi-layer piezoelectric ceramic component according to the second embodiment of the present disclosure.

In the multi-layer piezoelectric ceramic component 1100, a connection failure can be detected by using an image of the first end surface 1101c. FIG. 32 is a perspective view of a part of the multi-layer piezoelectric ceramic component 1100. As shown in FIG. 32, it is assumed that the first internal electrodes 1102 include a first internal electrode 1102' that does not reach the first end surface 1101c.

Figure 33:
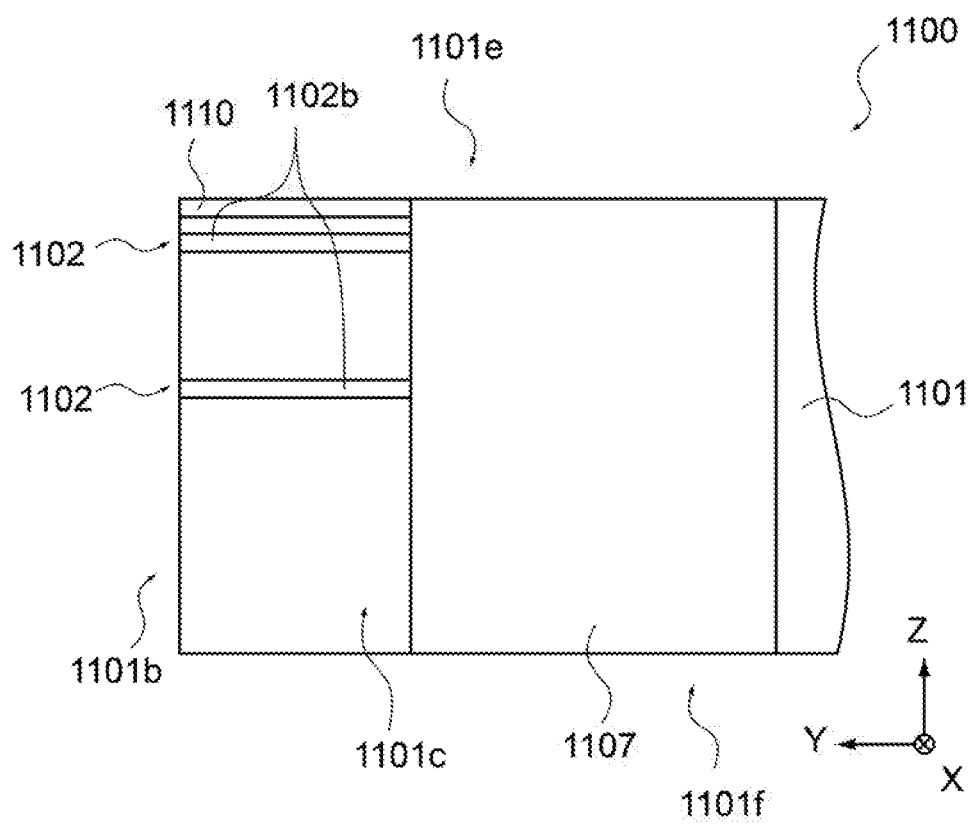
FIG. 33 is a plan view of the first end surface of the multi-layer piezoelectric ceramic component.

FIG. 33 is a schematic view of the first end surface 1101c in this case. As shown in FIG. 33, an exposed portion 1102b of the first internal electrode 1102' does not appear on the first end surface 1101c. This allows detection of the fact that the first internal electrode 1102' is not electrically connected to the first end surface terminal electrode 1107.

Specifically, in an inspection step for the multi-layer piezoelectric ceramic component 1100, an image of the first end surface 1101c is captured, and image processing is performed on this captured image, so that an image of the exposed portion 1102b can be detected. It is possible to detect a connection failure by the image processing at high speed and with precision.

The electrical connection between the third internal electrodes 1104 and the third end surface terminal electrode 1109 can also be detected in a similar manner. It should be noted that when the detection is performed by the image processing, the exposed portion 1102b and the exposed portion 1104b each need to have a certain size on the first end surface 1101c. The length T1 (see FIG. 28) and the length T2 (see FIG. 29) are each suitably 50 μm or more, and more suitably 100 μm or more.

Regarding Insulating Film

Figure 34:
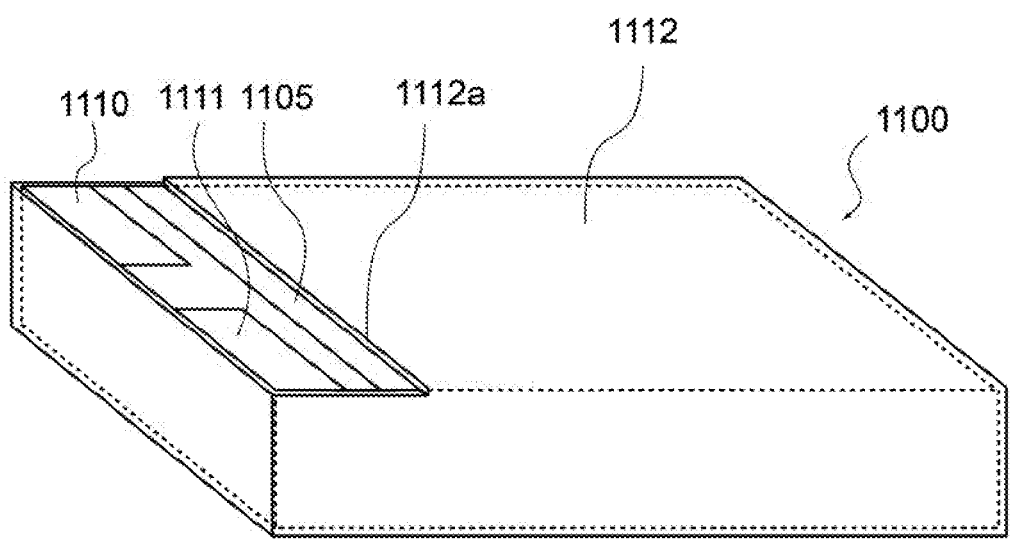
FIG. 34 is a perspective view of the multi-layer piezoelectric ceramic component.

The multi-layer piezoelectric ceramic component 1100 may include an insulating film. FIG. 34 is a perspective view of the multi-layer piezoelectric ceramic component 1100 including an insulating film 1112.

As shown in FIG. 34, the insulating film 1112 covers the outer periphery of the multi-layer piezoelectric ceramic component 1100. The insulating film 1112 includes an opening 1112a from which the first surface terminal electrode 1110, the second surface terminal electrode 1111, and the first surface electrode 1105 are partially exposed. Electrical connection to the first surface terminal electrode 1110, the second surface terminal electrode 1111, and the first surface electrode 1105 via the opening 1112a is established.

The range covered with the insulating film 1112 is not limited to the range shown in FIG. 34 and only needs to cover at least the first side surface 1101a and the second side surface 1101b at which the first internal electrodes 1102, the second internal electrodes 1103, and the third internal electrodes 1104 are exposed.

The material of the insulating film 1112 is not particularly limited as long as the material is an insulating material. For example, an insulating resin such as a SiN or acrylic resin is suitable. It should be noted that the insulating film 1112 is made of a material different from the material of the piezoelectric ceramic body 1101, and a soft material can be used therefor. Thus, a restraint effect provided by the insulating film 1112 can be made significantly small.

Regarding Production Method

A production method for the multi-layer piezoelectric ceramic component 1100 will be described.

Figure 35A:
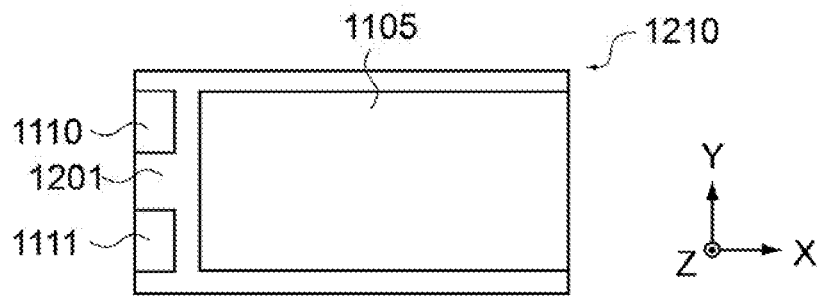
FIGS. 35A to 35E are each a schematic view of a sheet member to be used for producing the multi-layer piezoelectric ceramic component.
Figure 35B:
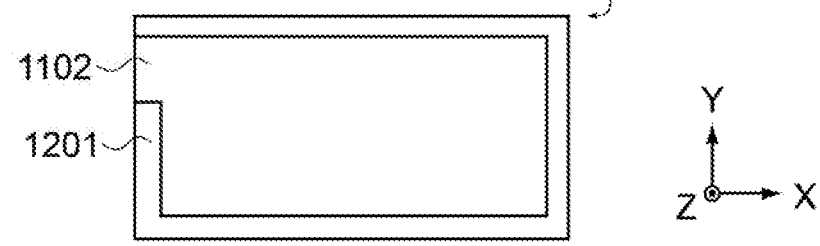

The multi-layer piezoelectric ceramic component 1100 can be produced by laminating sheet members. FIGS. 35A to 35E are schematic views of respective sheet members. FIG. 35A shows a sheet member 1210 including the first surface electrode 1105, the first surface terminal electrode 1110, the second surface terminal electrode 1111, and a piezoelectric ceramic body 1201. FIG. 35B shows a sheet member 1220 including the first internal electrode 1102 and the piezoelectric ceramic body 1201.

Figure 35C:
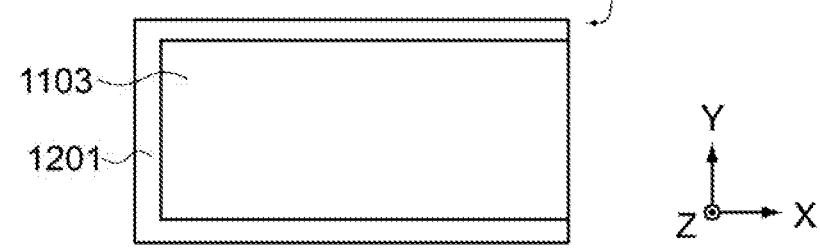
Figure 35D:
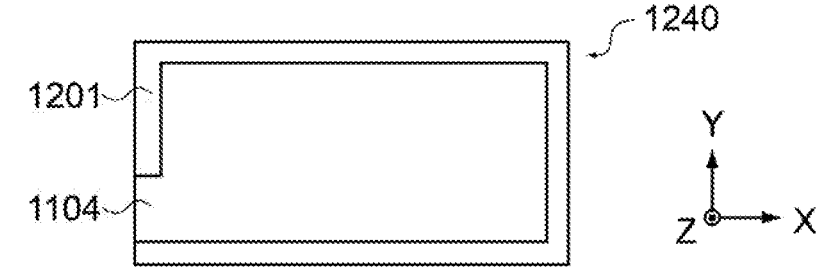
Figure 35E:
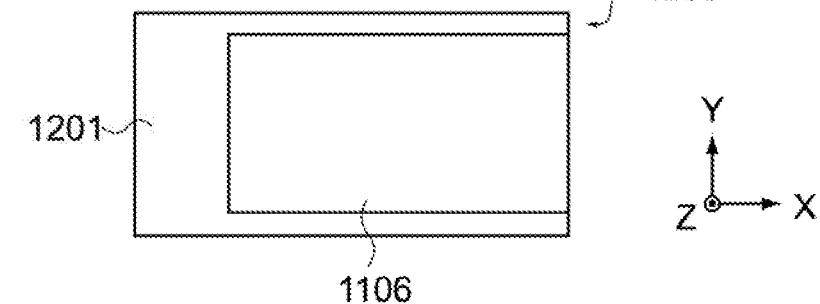

FIG. 35C shows a sheet member 1230 including the second internal electrode 1103 and the piezoelectric ceramic body 1201. FIG. 35D shows a sheet member 1240 including the third internal electrode 1104 and the piezoelectric ceramic body 1201. FIG. 35E shows a sheet member 1250 including the second surface electrode 1106 and the piezoelectric ceramic body 1201.

First, a sheet member including only a piezoelectric ceramic body (hereinafter, referred to as piezoelectric sheet member) is laminated on the sheet member 1250, and thereon, the sheet member 1240, a piezoelectric sheet member, and the sheet member 1230 are laminated in this order. Moreover, the sheet members 1240 and the sheet members 1230 are alternately laminated via piezoelectric sheet members.

Subsequently, the sheet members 1220 and the sheet members 1230 are alternately laminated via piezoelectric sheet members, and thereon, a piezoelectric sheet member and the sheet member 1210 are laminated in this order. Subsequently, this laminate is pressure-bonded, and a binder is removed by heating or the like.

Subsequently, sintering is performed. At this stage, each internal electrode is embedded in the piezoelectric ceramic body 1201, and side margins are formed. Subsequently, by heat treatment, the first end surface terminal electrode 1107 and the third end surface terminal electrode 1109 are formed on the first end surface 1101c, and the second end surface terminal electrode 1108 is formed on the second end surface 1101d.

Subsequently, the side margins are cut and removed. Accordingly, the piezoelectric ceramic body 1101 is formed from the piezoelectric ceramic bodies 1201. The cutting of the side margins can be performed by dicing or laser irradiation. When the side margins are cut, the first side surface 1101a and the second side surface 1101b are formed, and the first internal electrodes 1102, the second internal electrodes 1103, and the third internal electrodes 1104 are exposed at the first side surface 1101a and the second side surface 1101b (see FIG. 17).

Subsequently, the insulating film 1112 including the opening 1112a is formed (see FIG. 34). The insulating film 1112 can be formed by a method such as mist deposition, sputtering, or dipping. Subsequently, the first surface terminal electrode 1110 and the second surface terminal electrode 1111 are electrically connected, and a DC voltage is applied. This causes a polarizing process and activates the piezoelectric ceramic body 1101.

The multi-layer piezoelectric ceramic component 1100 can be produced as described above. It should be noted that the production method for the multi-layer piezoelectric ceramic component 1100 is not limited to the method described herein.

Regarding Piezoelectric Device

Figure 36:
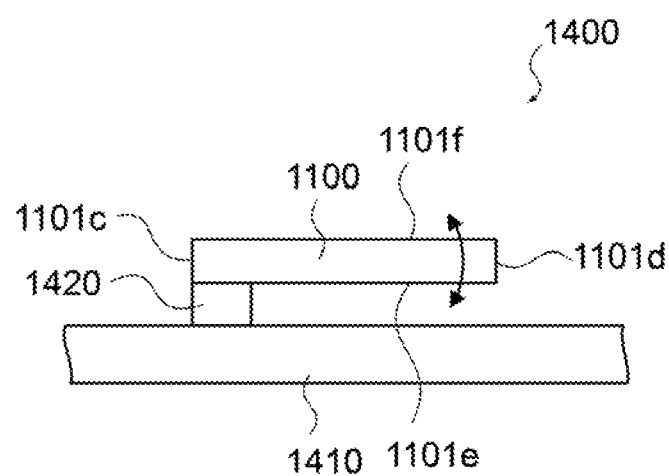
FIG. 36 is a schematic view of a piezoelectric device according to the second embodiment of the present disclosure.
Figure 36:
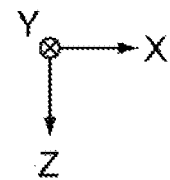

The multi-layer piezoelectric ceramic component 1100 can be mounted to a vibration member to configure a piezoelectric device. FIG. 36 is a schematic view of a piezoelectric device 1400 including the multi-layer piezoelectric ceramic component 1100. As shown in FIG. 36, the piezoelectric device 1400 includes the multi-layer piezoelectric ceramic component 1100, a vibration member 1410, and a joint 1420.

The vibration member 1410 is a metal plate or a glass panel of a display and is not particularly limited. The joint 1420 is made of a resin or the like and joins the multi-layer piezoelectric ceramic component 1100 to the vibration member 1410.

In the multi-layer piezoelectric ceramic component 1100, a region of the upper surface 1101e on the first end surface 1101c side is joined to the joint 1420. Wiring (not shown) is connected to the first surface terminal electrode 1110, the second surface terminal electrode 1111, and the first surface electrode 1105 via the joint 1420.

When a voltage is applied to each electrode, as described above, the multi-layer piezoelectric ceramic component 1100 is deformed in the Z direction (arrow in FIG. 36). This allows the vibration member 1410 to vibrate. It should be noted that the method of mounting the multi-layer piezoelectric ceramic component 1100 is not limited to that described herein. For example, the entire upper surface 1101e may be joined to the joint 1420.

Modified Example

In the above description, the multi-layer piezoelectric ceramic component 1100 is a bimorph multi-layer piezoelectric actuator in which a piezoelectric element is formed between the first internal electrodes 1102 and the second internal electrodes 1103 and a piezoelectric element is formed between the third internal electrodes 1104 and the second internal electrodes 1103, but the multi-layer piezoelectric ceramic component 1100 is not limited thereto. The multi-layer piezoelectric ceramic component 1100 may include only the first internal electrodes 1102 and the second internal electrodes 1103 without including the third internal electrodes 1104.

Figure 37:
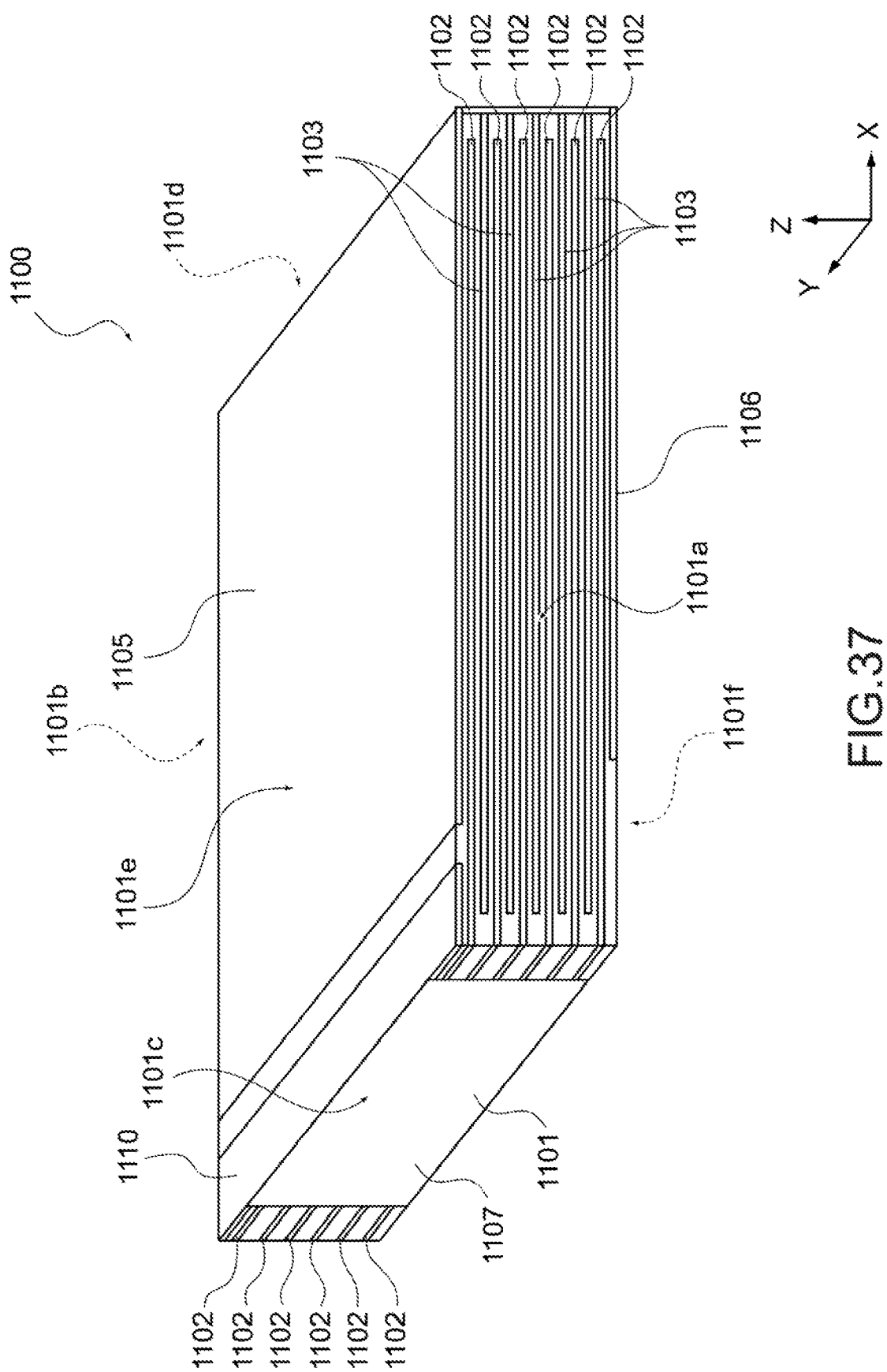
FIG. 37 is a perspective view of a multi-layer piezoelectric ceramic component according to a modified example of the present disclosure.

FIG. 37 is a perspective view of a multi-layer piezoelectric ceramic component 1100 including no third internal electrodes 1104. As shown in FIG. 37, the first internal electrodes 1102 are connected to the first end surface terminal electrode 1107 on the first end surface 1101c. Also in this configuration, a connection failure between the first internal electrodes 1102 and the first end surface terminal electrode 1107 can be detected on the basis of the presence/absence of an image of the first internal electrode 1102 on the first end surface 1101c.

EXAMPLES

A multi-layer piezoelectric ceramic component having the structure described in the first embodiment was produced. A piezoelectric ceramic body was made of an alkali niobate-based material and had the length (X direction) of 36 mm, the width (Y direction) of 1.4 mm, and the thickness (Z direction) of 0.8 mm. The thickness (Z direction) of each of the first region and the second region was 0.4 mm.

After a polarizing process, drive voltages (8 kV/mm in the first region, −0.85 kV/mm in the second region) were applied, and a displacement of ±0.72 mm occurred. This amount of displacement is 1.3 to 1.5 times the amount of displacement of the multi-layer piezoelectric ceramic component including the side margins (see FIG. 13). This reveals that the amount of displacement is improved in the multi-layer piezoelectric ceramic component according to the first embodiment.

What is claimed is:

1. A piezoelectric device, comprising:
   a vibration member;
   a joint; and
   a multi-layer piezoelectric ceramic component mounted to the vibration member via the joint,
   the multi-layer piezoelectric ceramic component including
      a piezoelectric ceramic body
         having a cuboid shape in which a length is larger than a width and the width is larger than a thickness,
         having an upper surface and a lower surface facing each other in a thickness direction, a first end surface and a second end surface facing each other in a length direction, and a pair of side surfaces facing each other in a width direction, and
         including a first region on a side of the upper surface in the thickness direction and a second region on a side of the lower surface in the thickness direction,
      first internal electrodes that are formed in the first region and are drawn to the first end surface,
      second internal electrodes that are formed in the second region and are drawn to the first end surface,
      third internal electrodes that are formed in the first region and the second region and are drawn to the second end surface, the third internal electrodes being laminated alternately with the first internal electrodes in the first region at predetermined distances from the respective first internal electrodes in the thickness direction and being laminated alternately with the second internal electrodes in the second region at predetermined distances from the respective second internal electrodes in the thickness direction,
      a first end surface terminal electrode that is formed on the first end surface and is electrically connected to the first internal electrodes,
      a first surface terminal electrode that is formed on the upper surface and is electrically connected to the first end surface electrodes,
      a second end surface terminal electrode that is formed on the first end surface, is electrically insulated from the first end surface terminal electrode, and is electrically connected to the second internal electrodes,
      a second surface terminal electrode that is formed on the upper surface and is electrically connected to the second end surface electrodes,
      a third end surface terminal electrode that is formed on the second end surface and is electrically connected to the third internal electrodes, and
      a first surface electrode that is formed on the upper surface, is electrically connected to the third end surface terminal electrode, and extends from the second end surface side toward the first surface terminal electrode and the second surface terminal electrode to face and overlap the first internal electrodes as viewed in the thickness direction,
      wherein the first internal electrodes, the second internal electrodes, and the third internal electrodes each having a width equal to a distance between the pair of side surfaces, and
      a region of the upper surface on the first end surface side is joined to the joint.

2. A piezoelectric device according to claim 1, further comprising:
   a second surface electrode that is formed on the lower surface, is electrically connected to the third end surface terminal electrode, extends from the second end surface to face one of the second internal electrodes.

3. The piezoelectric device according to claim 2, wherein the pair of side surfaces are covered with an insulating film made of an insulator different from the piezoelectric ceramic body.

4. The piezoelectric device according to claim 3 wherein the insulator is made of an insulating resin material.

5. A piezoelectric device according to claim 1, wherein the pair of side surfaces are covered with an insulating film made of an insulator different from the piezoelectric ceramic body.

6. The piezoelectric device according to claim 5 wherein the insulator is made of an insulating resin material.

7. The piezoelectric device according to claim 1, wherein the first surface electrode extends on the upper surface in a manner being adjacent to the first surface terminal electrode and the second surface terminal electrode.

* * * * *